United States Patent [19]

Kajimoto et al.

[11] Patent Number: 5,420,824

[45] Date of Patent: May 30, 1995

[54] LARGE-SCALE SEMICONDUCTOR INTEGRATED CIRCUIT DEVICE AND METHOD FOR RELIEVING THE FAULTS THEREOF

[75] Inventors: Takeshi Kajimoto, Tokyo; Mitsuteru Kobayashi, Saitama; Katsuyuki Sato; Yutaka Shimbo, both of Tokyo, all of Japan

[73] Assignee: Hitachi, Ltd., Tokyo, Japan

[21] Appl. No.: 180,510

[22] Filed: Jan. 12, 1994

Related U.S. Application Data

[63] Continuation of Ser. No. 496,296, Mar. 20, 1990, abandoned.

[30] Foreign Application Priority Data

Mar. 20, 1989 [JP] Japan .................................. 1-65836

[51] Int. Cl.⁶ ............................................. G11C 13/00
[52] U.S. Cl. .................................. 365/230.01; 365/51; 365/227
[58] Field of Search ................. 365/51, 227, 228, 229, 365/230.01

[56] References Cited

U.S. PATENT DOCUMENTS

| | | | |
|---|---|---|---|
| 3,736,574 | 5/1973 | Gersbach | 365/229 |
| 4,658,377 | 4/1987 | McElroy | 365/230.01 |
| 4,694,428 | 9/1987 | Matsumura et al. | 365/51 |
| 4,752,911 | 6/1988 | Prevost et al. | 365/51 |
| 4,954,993 | 9/1990 | Yamaguchi et al. | 365/229 |

Primary Examiner—Terrell W. Fears
Attorney, Agent, or Firm—Antonelli, Terry, Stout & Kraus

[57] ABSTRACT

In LSI circuit devices having a plurality of subchips packaged therein and having specific functions, capacitance cutting buffer circuits are employed in conjunction with respective terminals of the subchips, and a driver is disposed at respective points where relatively long wiring lines are respectively sub-divided into a corresponding plurality of lines. As a result, signal transmission delay can be significantly reduced. The terminals of the subchips are also provided with a probing pad to test the operations of the subchips independently of one another. The subchips employ circuit blocks which are to operate simultaneously and in conjunction with the wirings of the subchips, power supply lines are disposed correspondingly to the distributively arranged circuit blocks. Bus lines also controllably transmit addresses as well as data signals in a time sharing manner. Furthermore, each of the subchips has a fault test circuit. The subchips which have a DC fault is electrically isolated thereby allowing the remainder of the subchip to be usable. In the fault relieving technique employed, a combination of memory locations wherein no fault exists is selected for use, thereby allowing the construction of an LSI even with subchips which correspond to faulty bit addresses. The fault relieving technique employed uses an address converting circuit for faulty addresses, this operation being performed automatically within the chip system.

24 Claims, 24 Drawing Sheets

LARGE-SCALE SEMICONDUCTOR INTEGRATED CIRCUIT DEVICE AND METHOD FOR RELIEVING THE FAULTS THEREOF

This application is a continuation of application Ser. No. 07/496,296, filed on Mar. 20, 1990, now abandoned.

BACKGROUND OF THE INVENTION

1. Field of the Invention

The present invention relates to a large-scale (e.g., wafer-scale) semiconductor integrated circuit device and a method of retrieving the fault of the same and, more particularly, relates to a technology which is effective for application to a large-scale semiconductor integrated circuit device such as a wafer hole having a memory circuit such as a RAM (Random Access Memory) and a method of relieving a fault therefrom.

2. Description of the Related Art

A known semiconductor memory device made of a very large wafer LSI is exemplified in Japanese Patent Laid-Open No. 59-201441. In this large wafer semiconductor memory device, as disclosed in the above Japanese Patent Laid-Open number, the isolation and relief of a defective chip are accomplished by cutting the fuse or power supply line through irradiation by using a focused ion beam or laser beam and by connecting only good chips (i.e. non-defective chips) through final wiring lines. Topics related to the super LSI of the next generation having the supercomputer functions packed in a silicon wafer having a diameter of about 10 cm has been discussed on Dec. 21, 1985 in the Nikkei Sangyo Newspaper.

The large wafer semiconductor integrated circuit device described above has not taken into consideration the signal delay in the internal signal lines, the concentration of the operating current, and aspects concerning improving the versatility thereof, and a variety of problems associated therewith which must be solved for the large-scale semiconductor integrated circuit device having a large wafer to be realizable. On the other hand, the relief of a fault is accomplished by cutting (i.e. electrically isolating) the defective or faulty chip discovered thereby resulting in a problem of a substantial drop in the degree of integration.

SUMMARY OF THE PRESENT INVENTION

Therefore, an object of the present invention is to provide a large-scale semiconductor integrated circuit device which can be easily systemized.

Another object of the present invention is to provide a large-scale semiconductor integrated circuit device which realizes a high integration and a high speed.

Still another object of the present invention is to provide a fault relieving method which makes it possible to exploit such a memory circuit packaged in a large-scale semiconductor integrated circuit device even when it contains a faulty portion.

The aforementioned and other objects and novel features of the present invention will become more apparent from the detailed description given in this specification with reference to and together with the accompanying drawings of the preferred embodiments.

Representative aspects of the present invention disclosed herein, which will be described in greater detail subsequently, will now be briefly described in the following. A capacitance cutting buffer circuit, i.e. a buffer circuit which effects in electrical isolation (deactivation), is disposed commonly at either each terminal of each one of a plurality of subchips having specific functions or with respect to two or more terminals arranged close to each other, and a driver is disposed at each of the points where a relatively long wiring line is divided into a plurality of lines. Each of the above-mentioned terminals of said subchips is provided with a probing pad. Switch means to be switched by memory means, which can be programmed after a circuit has been completed over a semiconductor wafer, can be used to set at least one address signal which is necessary for accessing a memory circuit, data and a clock pulse. Such memory means includes fuse means which, when cut, turns on the switch circuit for transmitting the corresponding address signal, data and clock pulse to the memory circuit. Simultaneously, operable circuit blocks are dispersed in each of said subchips, and power supply lines are disposed to correspond to the dispersed circuit blocks. A memory circuit becomes accessed by transmitting through a shared signal transmission route an address signal and data in a time sharing manner. A switch circuit becomes switched by the combination of a bus width setting signal and an address signal stored in the memory means which can be programmed after a circuit has been completed. A first word line, selected by a word line selecting circuit, becomes coupled to a small number of memory cells which are to be simultaneously selected and a second word line which is to be coupled to a large number of memory cells are provided, and the index information stored in the memory cell corresponding to said first word line is compared with the search information fed from the outside so that the stored information of the memory cell coupled to said second word line may be read out in response to a coincidence output of the above comparison. A test circuit is provided for generating a signal to test the operations of each of said subchips and decide the propriety of the same, and a memory circuit is provided for latching the propriety result of said test circuit. In a large-scale semiconductor integrated circuit device packaging a plurality of subchips having specific functions, that one of a plurality of memory mats of memory circuits constituting subchips which has a DC fault is electrically isolated by a switch circuit. A combination which does not have a faulty bit is selected from a plurality of memory circuits composing said subchips in accordance with address information to connect the data terminal selectively to a data bus so that it may be used for storing data composed of a fewer number of bits than that of the total terminal number of said memory circuits. An address converting circuit for a memory circuit constituting said subchips is provided for access conversions without accessing a fault address so that a memory cell array may be selected.

According to the means thus far described, the capacitances of the terminals of the subchips are isolated from the wiring capacitances of the signal buses by the capacitance cutting buffer circuit, and the wiring capacitance corresponding to the respective signal buses becomes divided so that the parasitic capacitance can be reduced while raising the speed together with the provision of the aforementioned drivers. By the aforementioned pads, the probing test can be accomplished for each of the subchips. The switch means to be switched by memory means, which can be programmed after a circuit has been completed over a semiconductor wafer, can be used to set at least one address signal which is necessary for accessing a memory circuit, data and a clock pulse so that the versatility of the system can be enhanced. At the same time, the aforementioned test can be facilitated because the subchips can be electrically separated in the state where the fuse means is not cut. Since the power supply lines are provided for the circuit blocks dispersed respectively in the subchips, the power can be supplied through the wiring lines having relatively small current capacities. The wiring area can be reduced by transmitting the address signal and the data in a time sharing manner. Since the bus width can be set by the switch circuit, the memory circuit formed in the semiconductor wafer is made versatile. By having high-speed selecting operations associated with first word lines which are coupled to a small number of memory cells, it is possible to provide a memory circuit having a high-speed searching function. The self-check can be ensured by the builtin test circuit. The good (or properly functioning) portions of the memory circuit containing defective bits can be effectively used by electrically isolating those memory mats having DC faults from the switch circuit, by using more memory circuits than the bit number of the data, or by providing the address converter circuit.

BRIEF DESCRIPTION OF THE PREFERRED EMBODIMENTS

Figure 1:
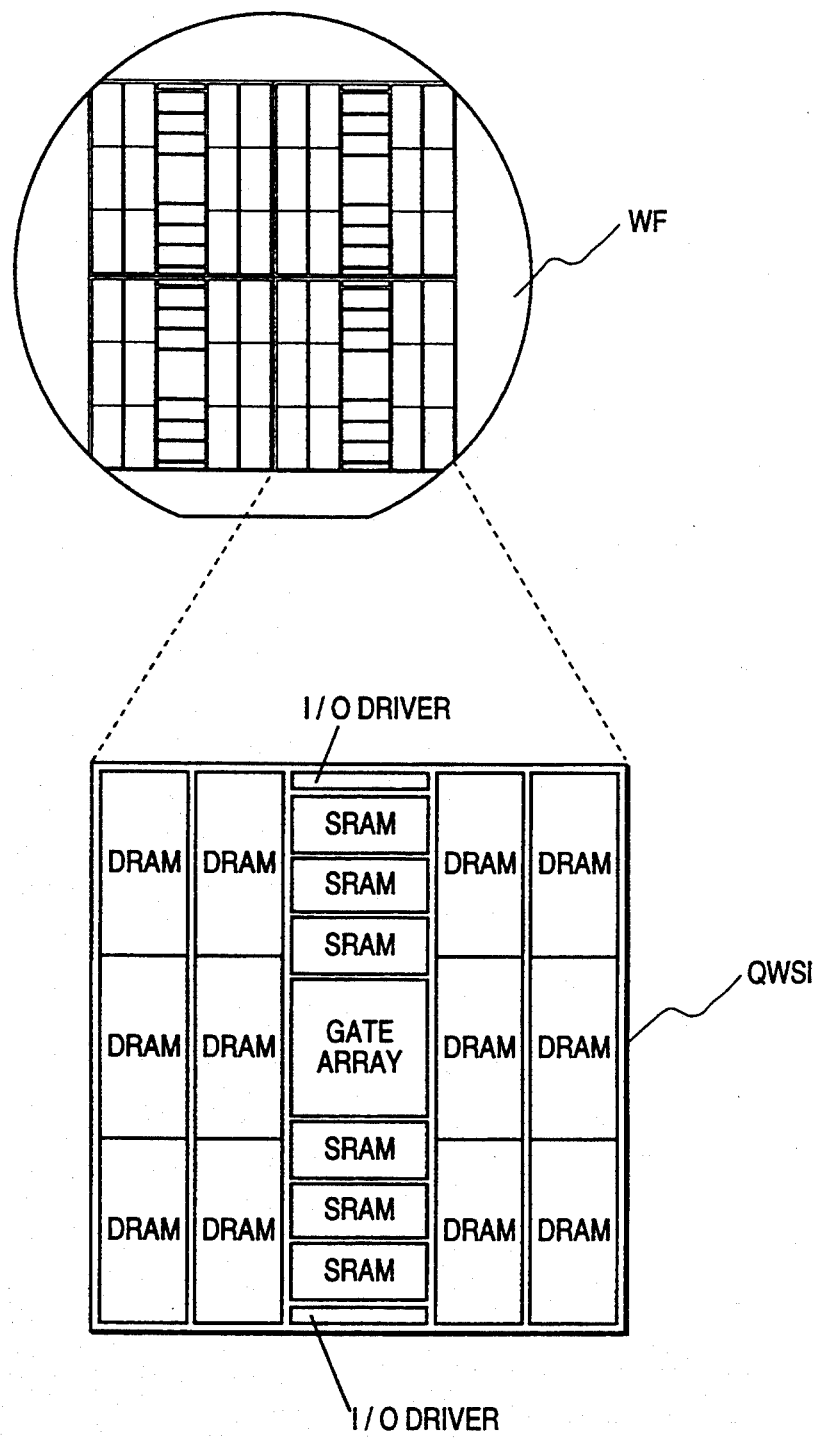
FIG. 1 is a schematic block diagram showing one embodiment of the large-scale semiconductor integrated circuit device according to the present invention.

FIG. 1 is a schematic block diagram showing one embodiment of a large-scale (e.g. wafer-scale) semiconductor integrated circuit device according to the present invention.

A large-scale semiconductor integrated circuit device QWSI is so large-scaled that only four are formed from one semiconductor wafer WF having a diameter of about 12.5 cm. Thus, the large-scale semiconductor integrated circuit device QWSI is a semiconductor chip sized as large as 45 mm×45 mm, for example. In other words, the large-scale semiconductor integrated circuit device QWSI is made to have a quarter size, i.e., about one quarter as large as the wafer size. As shown in FIG. 1, the individual circuit blocks constituting the large-scale semiconductor integrated circuit device QWSI are geometrically arranged, as shown, over the actual semiconductor wafer WF. It should be understood that FIG. 1 shows only the arrangement of the circuit blocks whereas the wiring channels are interposed between the individual circuit blocks.

Figure 2:
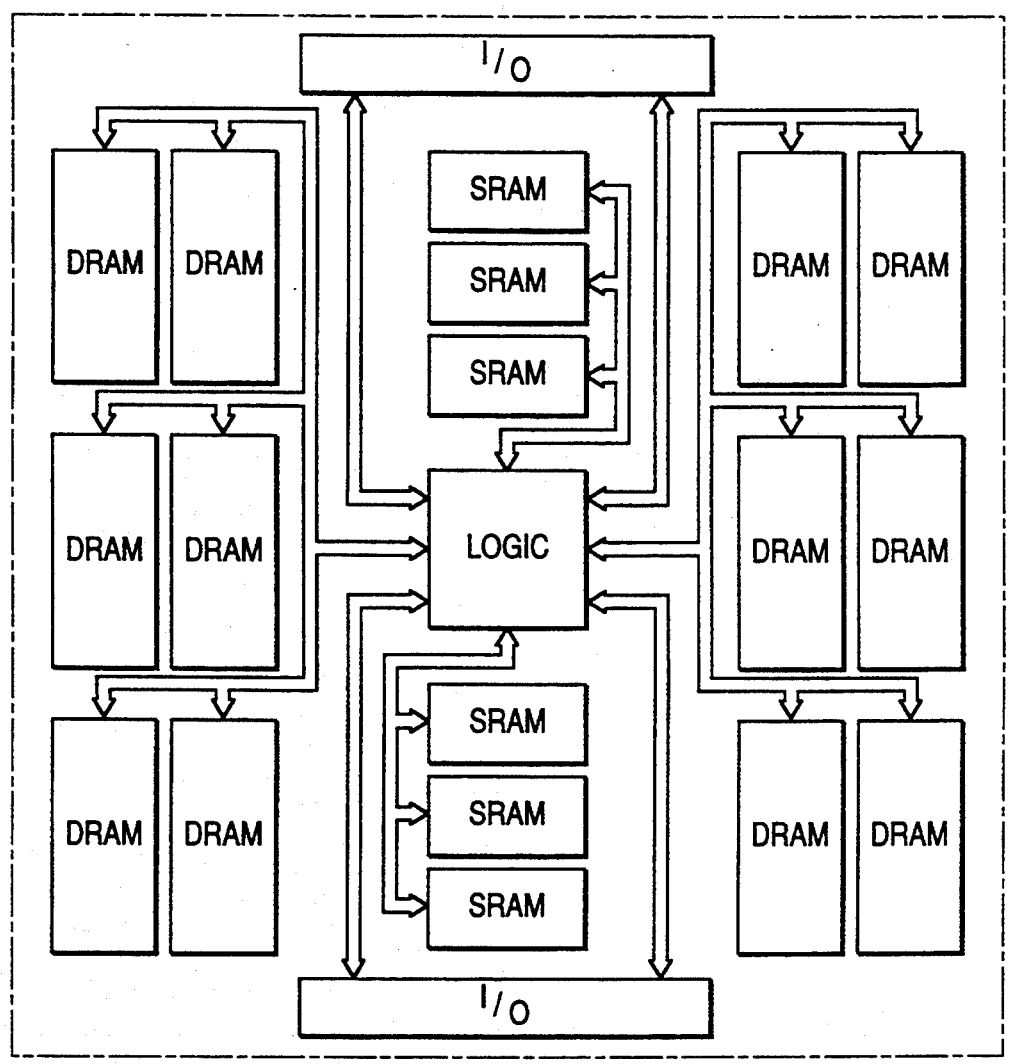
FIG. 2 is a block diagram showing one embodiment of the aforementioned large-scale semiconductor integrated circuit device.

FIG. 2 is a block diagram showing the large-scale semiconductor integrated circuit device QWSI described above. The individual circuit blocks of FIG. 2 have respectively independent, specific circuit functions. Therefore, these circuit blocks are identical semiconductor chips corresponding to DRAMs and SRAMs or gate arrays of the prior art so that they will be called "subchips."

The sub-chips DRAMs constitute dynamic RAMS and each has a relatively large storage capacity such as about 4M bits, although not especially limited thereto. This embodiment is required to have a storage capacity of about 3M bytes as a whole by the dynamic RAMs so as to realize a file locating function, as will be described in the following. In this embodiment, on the contrary, twelve subchips are incorporated with a storage capacity surplus considering the faults in the subchips constituting the dynamic RAMs to be packaged in the large-scale semiconductor integrated circuit device. For the aforementioned file locations, moreover, the static RAMs are required as a whole to have a storage capacity of about 20K bytes. Considering the failures in the subchips, however, there are incorporated totally six static RAMs each having a storage capacity of 64K bits.

A subchip LOGIC constitutes a logic circuit unit and is constructed of a gate array, although not especially limited thereto, to have a function as a memory control circuit for access controls of the above-specified two kinds of memory circuits. By using the gate arrays described above, the aforementioned subchips DRAMs and SRAMs can be used to constitute a memory system Capable of coping with the functions and applications desired by the user.

Although not especially limitative, the aforementioned large-scale semiconductor integrated circuit device QWSI is used as a file locating system having a large storage capacity and is assigned to the title locating function of the system. As a result, the logic circuit unit LOGIC has a variety of functions associated with the locations. Specifically, the unit LOGIC not only acts as a mere digital comparator but also has functions such as a fuzzy locating function or a memory accessing function.

Subchips I/O constitute interfaces for connections with the system buses of the aforementioned memory system or microprocessors of 8 bits.

Figure 3:
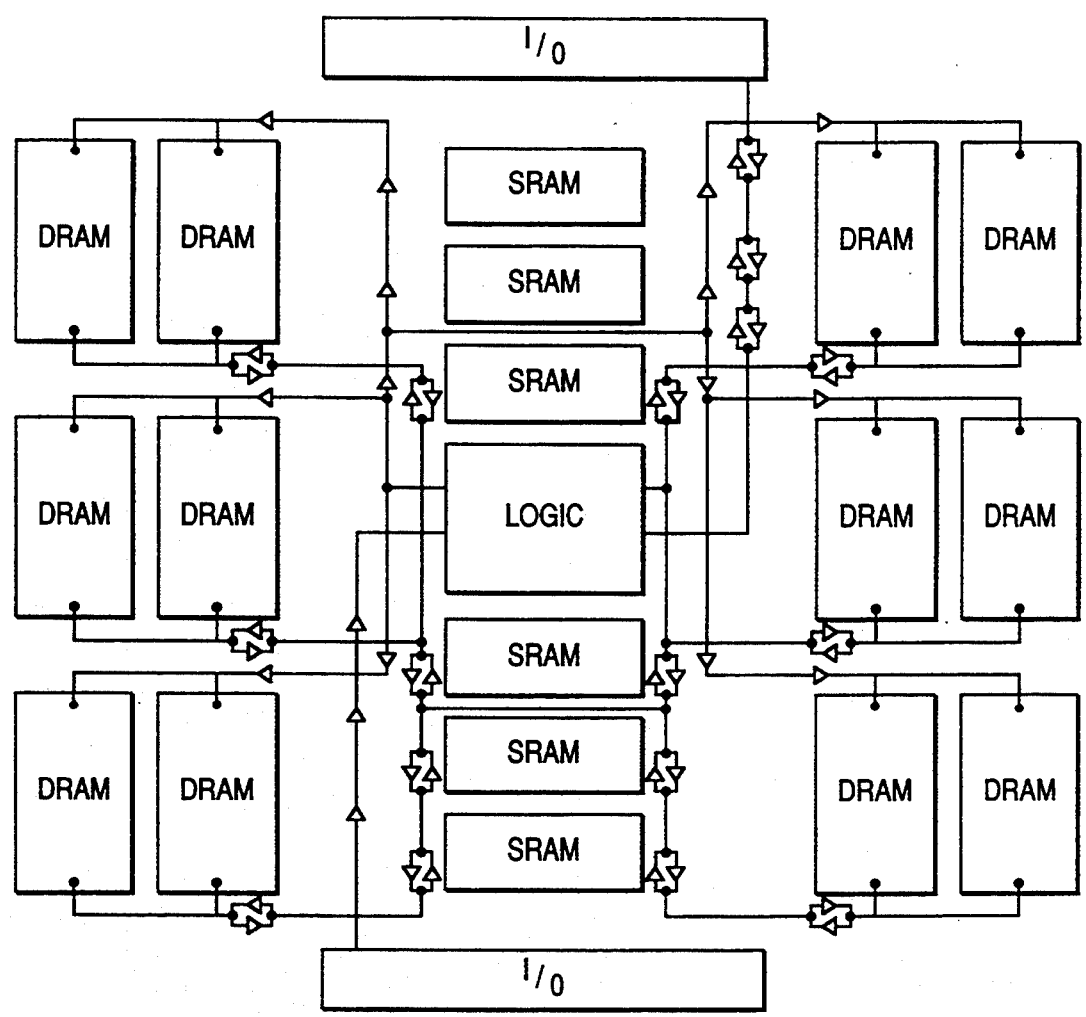
FIG. 3 is a block diagram showing one embodiment of the signal transmission route for connecting the subchips constituting the aforementioned large-scale semiconductor integrated circuit device.

FIG. 3 is a block diagram showing one embodiment of signal transmission routes for connecting the aforementioned individual subchips. In FIG. 3, there are illustrated: signal routes interposed between the subchip LOGIC acting as the control circuit and the subchips DRAMs acting as dynamic RAMs for transmitting address signals of one bit; and signal routes for transmitting data of one bit.

In each of the DRAM subchips, the small symbols □ are wafer probing pads. As a result, each of the subchips DRAMs can be independently accessed from the system, when a circuit is formed in the semiconductor wafer, by using the aforementioned pads, so that it can be individually tested for malfunctions. Each of the pads thus disposed is equipped with an electrostatic breakdown preventing circuit in a corresponding manner. In this structure, therefore, each subchip has a relatively large parasitic capacitance at its terminals. This parasitic capacitance becomes enlarged at the signal bus for the signal transmission, thus causing a delay of signal propagation in the signal buses.

In the subchips of this embodiment, therefore, with a view to reducing the capacitance which causes such signal propagation delays, there are provided buffer circuits which correspond, as indicated by rightward and leftward pointing triangles in FIG. 3, to the terminals associated with the same signal at the adjacent two subchips DRAMs. These buffer circuits are constructed of two inverter circuits having cascade connections, although they are not limited thereto, in the signal buses in which transmissions of signals such as address or control signals are performed only in one direction. In the signal buses for hi-directional transmissions of signals such as data, there are used two-way buffer circuits, as will be described in the following. By thus providing these buffer circuits such as illustrated in FIG. 3, for example, the wiring capacitances corresponding to the signal buses to be connected with the address, control and data terminals of each of the subchips DRAMs do not become adversely influenced, i.e. parasitically magnified, by the terminal capacitances at the side of each of the subchips.

In this embodiment, considerations are given towards shortening the signal transmission routes for the memory circuit DRAMs or SRAMs by arranging the logic circuit unit LOGIC to be disposed as the control circuit at the center of the large-scale semiconductor chip described above. Unlike the case in which the control circuit is arranged at the periphery of the large-scale semiconductor chip, the signal bus according to the embodiment of FIG. 3 is not guided from one end to the other opposing end of the chips, but rather, since the control circuit is disposed at the center thereof, the signal bus maximum length can be reduced to about one half when it extends from the center of the respective chips to each of the individual ends thereof.

In the aforementioned large-scale semiconductor integrated circuit device, however, the wiring length from the logic circuit unit LOGIC which is at the center of the chip to the subchips DRAMs which are located at the ends (end sides) of the chip is relatively greater than that associated with those subchips DRAMs which are more centrally located on the chip. As a result, the signal propagation delay time is elongated to obstruct the high-speed operations. In FIG. 3, like the aforementioned buffer circuits, drivers are indicated at upwardly or downwardly pointing triangles. As a matter of fact, each of the drivers of the circuit device, as are the buffer circuits, is constructed of two inverter circuits which are connected in cascade. The drivers disposed in the data bus for data transmission therethrough have a tri-state output function so as to allow the transmission of signals in both (opposing) directions. In the case where a signal voltage is to be transmitted from one end of the data bus to the other end thereof, the output of the driver having its output terminal connected with said one end is raised to a high impedance state. On the other hand, in the case where the signal voltage is being transmitted from the other to said one end, the output of the driver having its output terminal connected with said other end is raised to the high impedance state. As a result, the two-way driver disposed in the data bus uses as its output circuit a clocked inverter circuit having the aforementioned tri-state output function.

If the capacitance value at the terminal of each of the aforementioned subchips is far greater than the input capacitance of the input inverter circuit constituting the buffer circuit, a capacitance cutting buffer circuit may be provided for each terminal. Thus, the number of capacitance cutting buffers used in connection with each of the respective subchips provided on the chip are determined in dependence upon the balance (relative difference) between the input capacitance of the respective buffer circuits and the parasitic capacitance at the side (end side) of the subchips, at the terminals thereof, to be cut (reduced) by the former.

From FIG. 3, there are omitted the wiring lines between the logic circuit unit LOGIC and the subchips SRAMs so as to prevent the illustrations from being too complicated. As a matter of fact, like the aforementioned subchips DRAMs, the subchips SRAMs are similarly equipped with signal transmission routes including pads and buffer circuits.

Although not especially specifically limited thereto, the data to be transferred with the system buses are transmitted between the upper interface I/O and the logic circuit unit LOGIC, and the clock signal and the control signal are given from the side of the system between the lower interface I/O and the logic circuit unit LOGIC.

Figure 4:
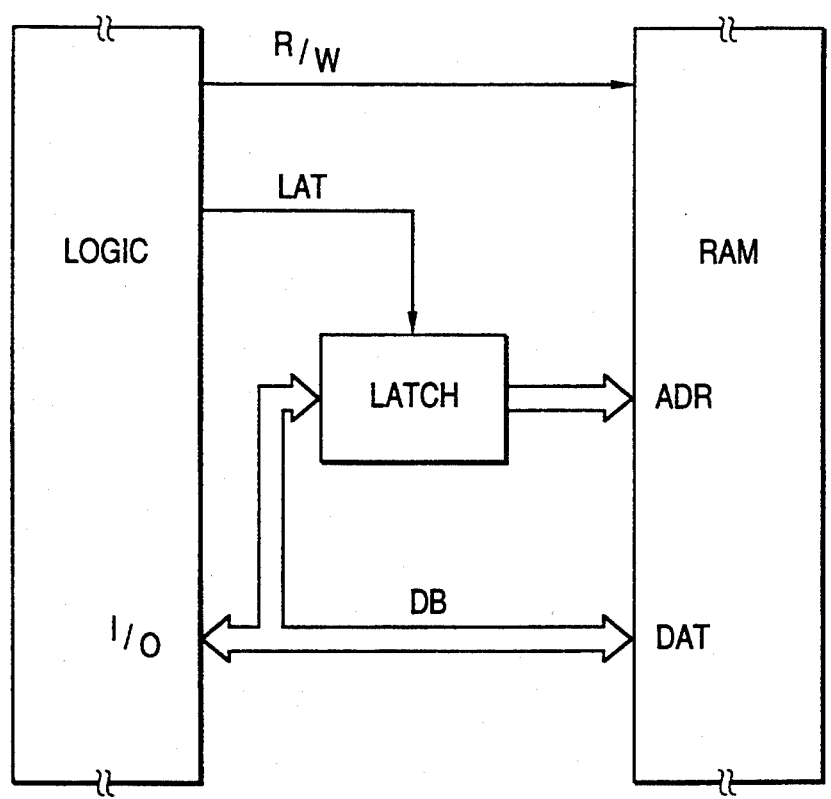
FIG. 4 is a block diagram showing one embodiment of the signal transmission route between the logical circuit portion and the subchips.

FIG. 4 is a block diagram showing one embodiment of the signal transmission routes between the aforementioned logic circuit unit LOGIC and subchips.

In the file locating system described above, for example, the total number of the various buses corresponding to each chip of the wafer for connecting the logic circuit unit LOGIC and the memory circuits DRAMs and SRAMs acting as the subchips is as large as about 120. The multi-layering of the wiring channels to be formed in a semiconductor substrate is far less than that of the printed substrate. Therefore, the large-scale semiconductor integrated circuit device of this embodiment is required to have a relatively large region for the wiring channels.

In order to reduce the aforementioned wiring number, according to this embodiment, the address signal and the data are transmitted in a time sharing manner by using the logic circuit unit LOGIC and the specified subchip RAM (i.e., the dynamic or static RAM). Specifically, the logic circuit unit LOGIC sends out the address signal from the terminal I/O through the data bus DB. In synchronism with the transmission of the address signal, the logic circuit unit LOGIC transmits a control signal LAT such as an address strobe signal. The aforementioned subchip has its input portion equipped with a latch circuit LATCH. This latch circuit LATCH is synchronized with the aforementioned address strobe signal LAT to fetch the address signal sent from the data bus DB and feed it to an address terminal ADR of the subchip RAM.

The logic circuit unit LOGIC sends out the aforementioned address signal and then a write data from the terminal I/O if in the write mode. This write data is fed through the aforementioned data bus DB to a data terminal DAT of the subchip RAM. The subchip has its write mode designated by a control signal R/W fed from the logic circuit unit LOGIC and is written in the memory cell which is selected by the address signal which is latched by the aforementioned latch circuit LATCH.

If the logic circuit unit LOGIC designates the read mode in response to the control signal R/W, the subchip RAM reads out the stored information of the memory cell, which is selected in accordance with the address signal latched in the aforementioned latch circuit LATCH, and sends it out from the data terminal DAT. The logic circuit unit LOGIC fetches the read data which has been transferred through the data bus DB.

Since the data bus is used in a time sharing manner according to this structure, it is possible to reduce the number of wiring lines to be formed in the large-scale semiconductor integrated circuit device. The aforementioned latch circuit LATCH may be constructed in the subchip RAM if the number of wiring lines is to be merely reduced. In case, however, the latch circuit LATCH is disposed outside of the subchip RAM as in the present embodiment, the address terminal ADR can be equipped with testing pads to test or probe the subchip RAM as a single body, i.e. test it individually.

Since, moreover, the subchips can be replaced by those having similar functions, the design of the system can be simplified. Depending upon the applications, specifically, it is possible to implement a RAM of an identical structure irrespective of whether accessing is performed by using an address bus and a separate data bus or using a data bus in the time sharing manner, such as described above. Here, the data bus may naturally be replaced by multiplexing the address bus for data transmissions.

Incidentally, in case the subchip is a dynamic RAM of an address multiplex type, the logic circuit unit LOGIC outputs a row address signal in synchronism with a row address strobe signal RAS and a column address signal in synchronism with a column address strobe signal CAS and then uses the data bus DB for data transfer. The dynamic RAM intrinsically has a latching function in a row address buffer. Thus, the aforementioned latch circuit LATCH may pass the row address signal therethrough to the dynamic RAM and may hold the column address signal in synchronism with the column address strobe signal CAS.

Figure 5A:
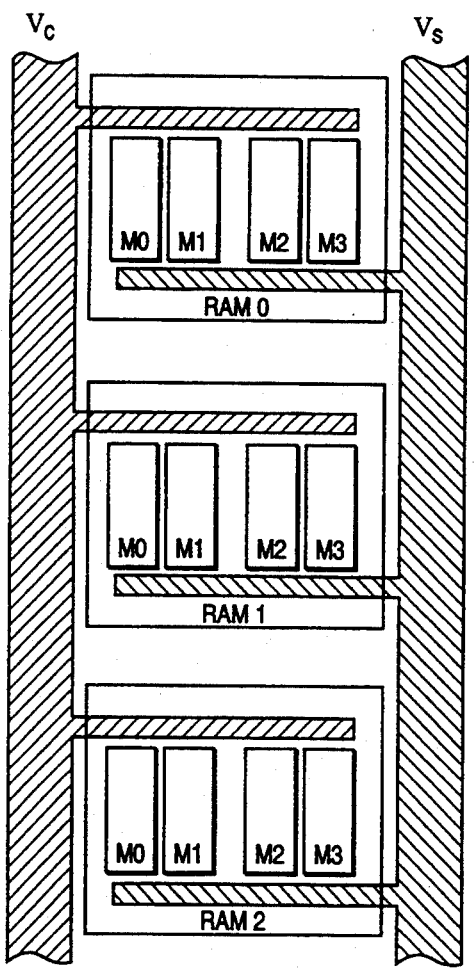
FIGS. 5(A) and 5(B) are block diagrams for explaining the power supply system of the subchips conceived prior to this invention.
Figure 5B:
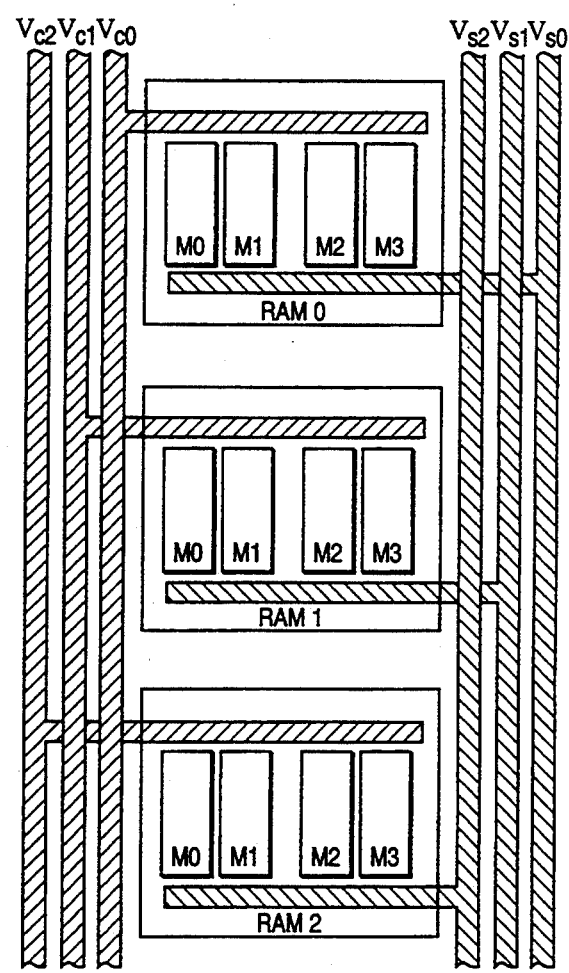

FIGS. 5(A) and 5(B) show examples of a power supply system of the subchips considered prior to the present invention.

In the simplest example of FIG. 5(A), each subchip is equipped with common power lines $V_c$ and $V_s$. In this structure, the resistance of the wiring lines formed in the semiconductor integrated circuit is higher by four figures or more than that of the wiring lines formed in the ordinary printed board. If, therefore, the power lines are shared as above, the noises generated by the operating currents flowing therethrough are transmitted among the subchips RAM0 to RAM2 which results in a major cause for malfunctions. As shown in FIG. 5(B), therefore, the subchips RAM0 to RAM2 are equipped with power wiring lines $V_{c0}$ to $V_{c2}$ and $V_{s0}$ to $V_{s2}$, respectively. With this type of structure, however, the number of wiring lines is enlarged thereby increasing the occupied area associated therewith.

Figure 6:
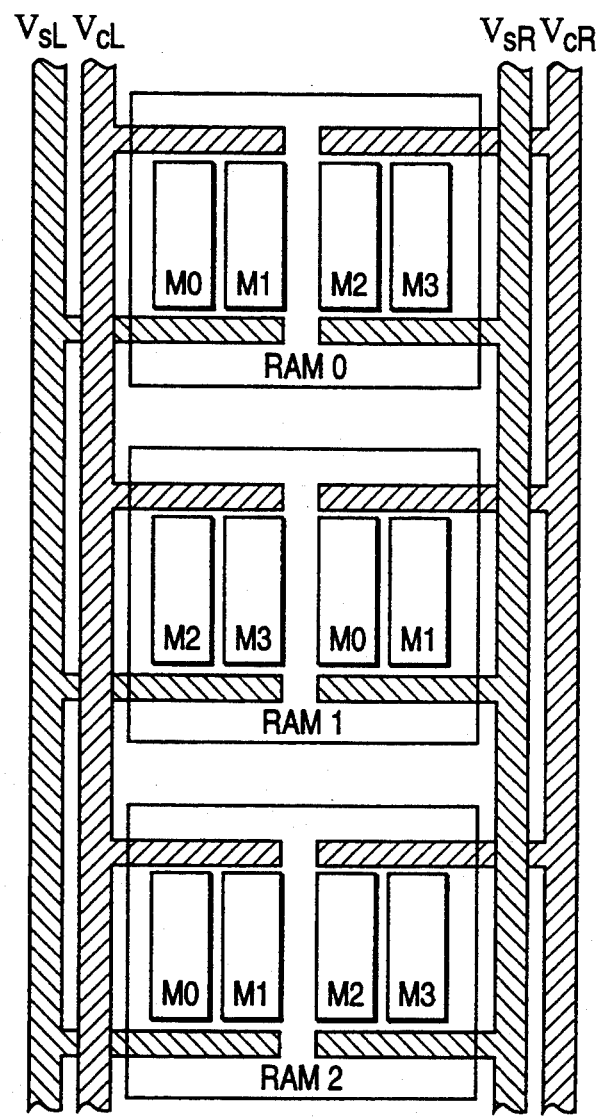
FIG. 6 is a block diagram showing one embodiment of the power supply system of the large-scale semiconductor integrated circuit device according to the present invention.

FIG. 6 is a block diagram showing one embodiment of the power supply system of the large-scale semiconductor integrated circuit device according to the present invention.

In this embodiment, the power supply line is halved in one subchip. In the subchip RAM0, the lefthand memory blocks M0 and M1 are connected with the power supply lines $V_{cL}$ and $V_{sL}$ arranged at the lefthand side, and the right-hand memory blocks M2 and M3 are connected with the power supply lines $V_{cR}$ and $V_{sR}$ arranged at the right-hand side.

In the remaining subchips RAM1 and RAM2, the memory blocks shared likewise to the right-hand and lefthand are connected with the corresponding power supply lines $V_{cL}$ and $V_{sL}$ or $V_{cR}$ and $V_{sR}$. In the two subchips RAM0 and RAM1 to be simultaneously operated, however, the address assignments of the memory blocks are reversed. Specifically, if the memory block M0 arranged at the lefthand side of the subchip RAM0 is selected, the memory block M0 to be likewise selected is arranged at the right-hand side of the subchip RAM1 to be simultaneously operated. Likewise, if the memory block M1 arranged at the lefthand side of the subchip RAM0 is selected, the memory block M1 to be likewise selected is arranged at the right-hand side of the subchip RAM1. If the memory block M2 arranged at the right-hand side of the subchip RAM0 is selected, the memory block M2 to be likewise selected is arranged at the lefthand side of the subchip RAM1. If the memory block M3 arranged at the right-hand side of the subchip RAM0 is selected, the memory block M3 to be likewise selected is arranged at the lefthand side of the subchip RAM1.

By these memory block divisions and address assignments, the operating current of one subchip RAM0 or RAM1 is supplied by one of the aforementioned two pairs of power supply lines $V_{cL}$ and $V_{sL}$ or $V_{cR}$ and $V_{sR}$ although the two subchips are simultaneously operated. As a result, the wiring width can be reduced to a relatively small value, and the noises are not transmitted between the subchips which are simultaneously operating so that the operation margin can be improved.

By accessing the two subchips RAM0 and RAM1 simultaneously as above, memory accesses at the unit of 4 bits can be accomplished to store data of 8 bits. In the memory circuit, two or more memory circuits are frequently operated together to enlarge their bit width. In the large-scale semiconductor integrated circuit device of this embodiment, therefore, the power supply can be efficiently accomplished by taking the aforementioned power supply system.

Figure 7:
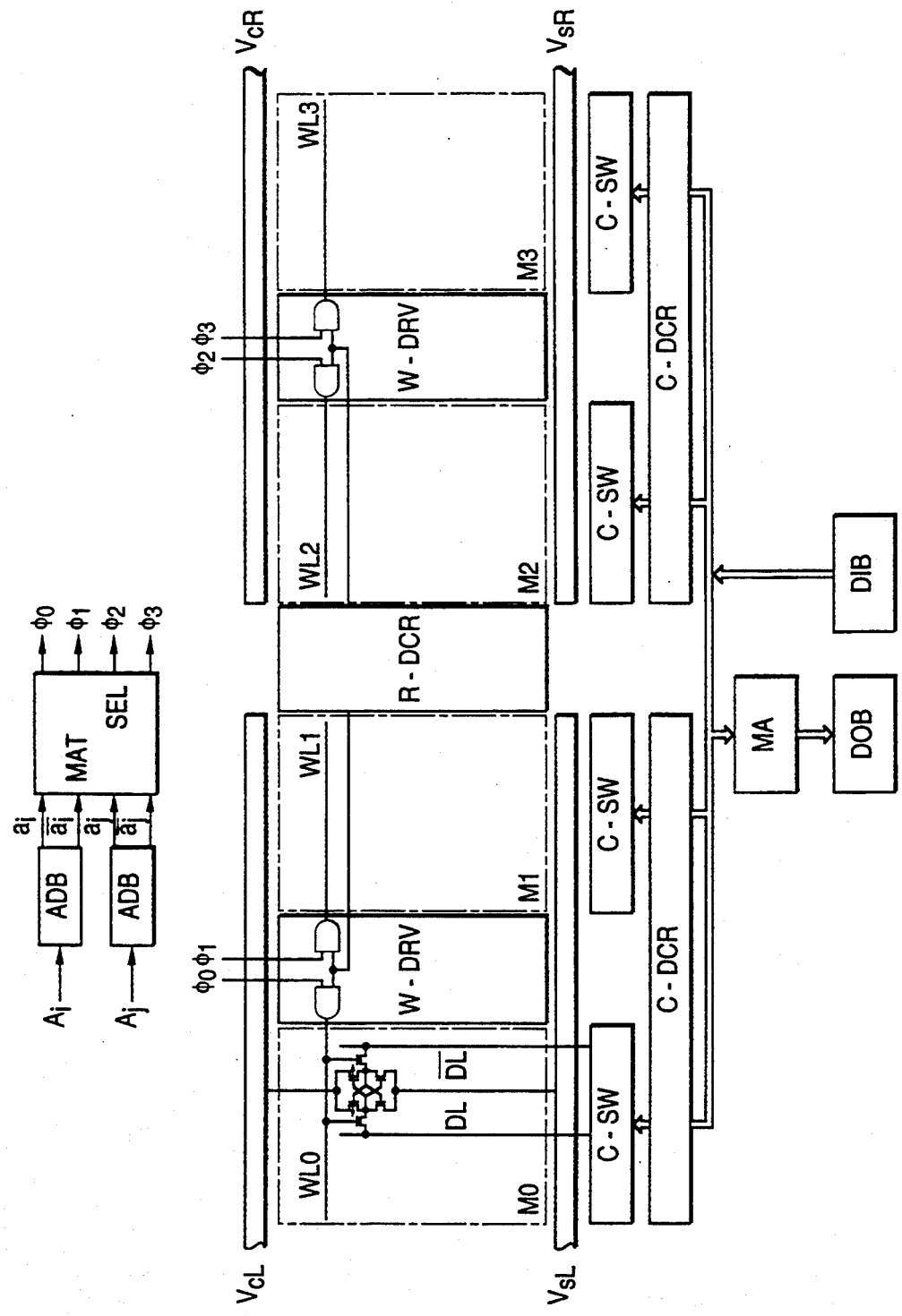
FIG. 7 is a block diagram showing one embodiment of the subchip to which is applied the aforementioned power supply system.

FIG. 7 is a block diagram showing the internal structure of one embodiment of the aforementioned subchip RAM0.

This embodiment is illustrated in the form of a static RAM. This memory array is constructed of four memory blocks divided, as has been described hereinbefore. The memory cell used is a completely static type memory cell constructed, as represented by the memory block M0, of: a latch circuit having a cross connection of the inputs and outputs of a pair of CMOS inverter circuits each one being composed of an N-channel MOSFET and a P-channel MOSFET in series connection therewith; and a pair of address selecting (accessing) N-channel MOSFETs disposed between the respective input/output nodes of the latch and the corresponding pair of complementary bit lines. The aforementioned address selecting MOSFETs have their gates connected with a word line WL0 which is illustrated as a representative. The input/output nodes of the memory cell, i.e., the source and drain of one of the aforementioned MOSFETs are connected with a pair of complementary bit lines (e.g., data or digit lines) BL and $\overline{BL}$, as representatively shown.

Word drivers W-DRV are interposed between the aforementioned two memory blocks M0 and M1 and M2 and M3. A row (X) decoder R-DCR is arranged at the center of the aforementioned four memory blocks. The selecting signal formed by the decoder R-DCR is fed to the right-hand and lefthand word drivers W-DRV. These word drivers W-DCR are exemplified by AND gate circuits, as shown. In response to the selecting signals of the aforementioned word lines and block selecting signals $\phi 0$ to $\phi 3$ corresponding to the respective memory blocks, the AND gate circuits select only one of the word lines WL0 to WL3. Thus, the aforementioned AND gate circuits have both the gate and drive functions. As a matter of fact, it is the current practice to construct the logic circuit for realizing the gate functions and the drive circuit separately of each other.

The aforementioned block selecting signals $\phi 0$ to $\phi 3$ are formed by a block (memory mat) selecting circuit. This block selecting circuit MATSEL decodes the address signals ai and ai, and aj and aj, which are formed by address buffers ADB which are responsive to address signals Ai an AJ of 2 bits, respectively, to form the aforementioned four block selecting signals $\phi 0$ to $\phi 3$.

Here, the power lines are divided into the left-hand and right-hand ones, i.e. $V_{cL}$ and $V_{sL}$ and $V_{cR}$ and $V_{sR}$, corresponding to the left-hand and right-hand memory blocks M0 and M1, and M2 and M3 as in the foregoing embodiment. In this case, not only are the memory block pairs M0 and M1, and M2 and M3 but also the column switch circuits C-SW and column decoders C-DCR are naturally connected with the aforementioned left-hand and right-hand power lines $V_{cL}$ and $V_{sL}$ and $V_{cR}$ and $V_{sR}$, respectively. The remaining peripheral circuits such as the decoder R-DCR, main amplifier MA, data output buffer DOB, data input buffer DIB and not-shown address buffers are so discretely connected with the power supply lines $V_{cL}$ and $V_{sL}$ and $V_{cR}$ and $V_{sR}$ that the current may be distributed substantially evenly.

in accordance with the aforementioned address assignment, according to this embodiment, the operating current is supplied from one of the aforementioned left-hand and right-hand power supply lines $V_{cL}$ and $V_{sL}$ and $V_{cR}$ and $V_{sR}$. If the memory array is thus divided in the direction of the word lines, the DC current flows through the bit lines only in the memory cell coupled to the word lines of one memory block so that the current consumption can be theoretically reduced to zero in the remaining three memory blocks. Thus, the power consumption of the SRAM can be reduced. Especially, the SRAM to be packaged in the large-scale semiconductor integrated circuit device as in the present embodiment has the advantage of providing low power consumption.

In this embodiment, the static memory cell may have its P-channel MOSFET replaced by a high resistor made of polysilicon layer. This high resistor is given such a high resistance as has a current supply capacity freed from losing the gate stored charges by the drain leakage current of the aforementioned N-channel MOSFET. Thus, the gate electrode of the N-channel MOSFET and the high resistor can be integrally formed, and the P-channel MOSFET and the N-channel MOSFET need not be separately formed unlike the CMOS circuit so that the integration can be made high.

The power supply can be efficiently provided by likewise dividing the memory array into blocks (or mats) even in the dynamic RAM and by dispersing the respective block addresses between the simultaneously operating dynamic RAMs like the foregoing embodiment. Since the dynamic RAM of address multiplex type receives the row address signal in advance, this row address signal is used for designating the aforementioned block addresses.

Figure 8:
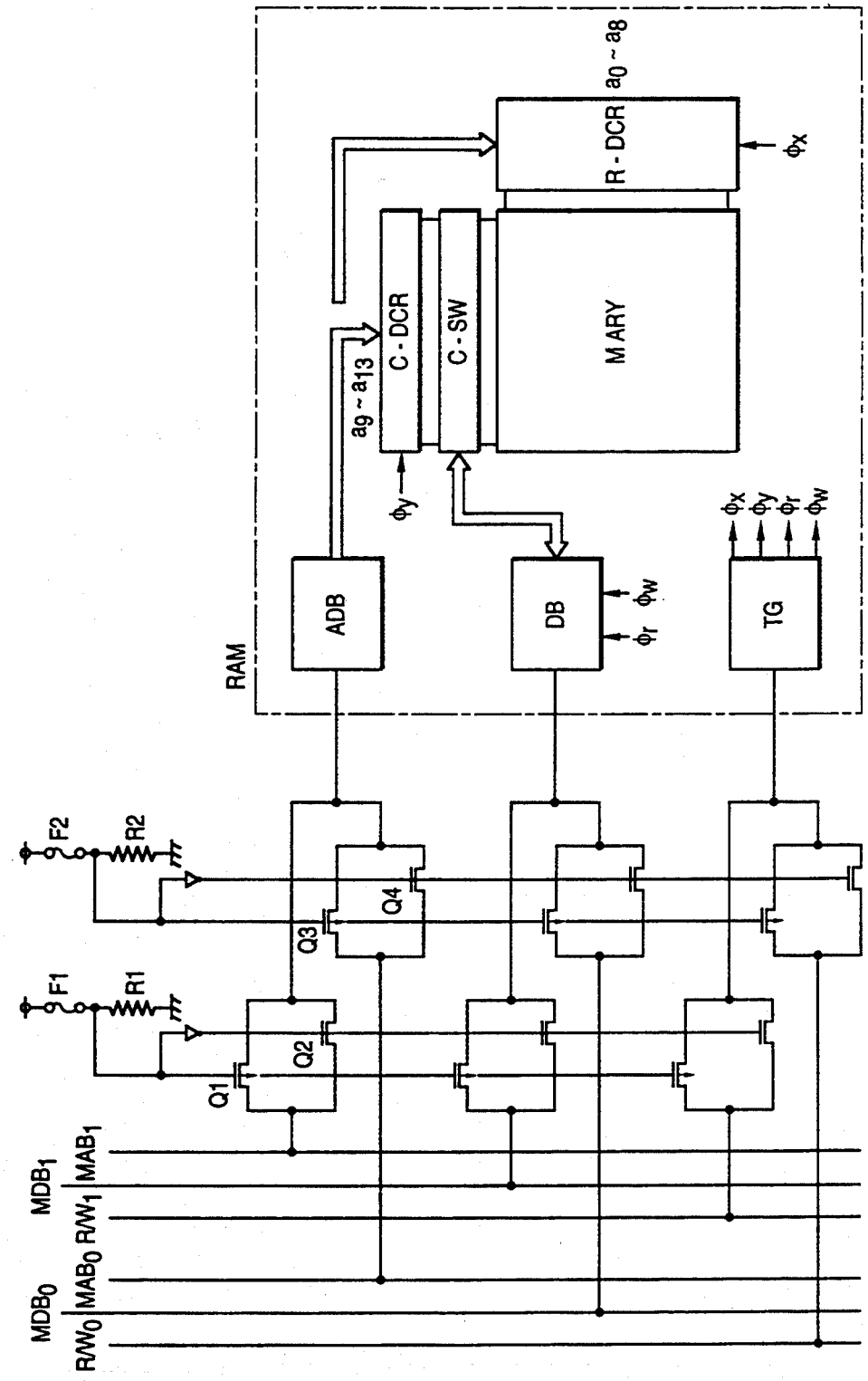
FIG. 8 is a block diagram showing one embodiment of the RAM to be packaged in the large-scale semiconductor integrated circuit device according to the present invention.

FIG. 8 is a block diagram showing one embodiment of the RAM to be packaged in the large-scale semiconductor integrated circuit device according to the present invention.

The RAM to be packaged in the large-scale semiconductor integrated circuit device like this embodiment is required for general purpose use. When the RAM is limited to a specific application, it may result in a breakdown of the functions of the whole system if it is defective. In order to give versatility to the RAM to be packaged in the large-scale semiconductor integrated circuit device, therefore, we have conceived that the circuit is completed over a semiconductor wafer so that the application of the RAM can be switched or set.

In the aforementioned file locating system, for example, the static RAM is used as calculating and FiFo (First-in First-out) memories. These calculating and FiFo memories are necessarily different in the address signals, the control signals such as clocks and the data bus to be connected therewith.

In this embodiment the aforementioned static RAM has its input unit equipped with a switching circuit made of MOSFETs, which are controlled by fuse means. In FIG. 8, there is representatively illustrated a switch circuit corresponding to each of an address signal, a data of 1 bit and a control signal.

The switch circuit of MOSFETs used is exemplified by a CMOS switch circuit in which a P-channel MOSFET Q1 and an N-channel MOSFET Q2 are connected in parallel. In connection with the address signal, the aforementioned CMOS switch circuit (Q1 and Q2) is provided to connect the input of the address buffer ADB and an address bus MAB1. The CMOS switch circuit likewise composed of a P-channel MOSFET Q3 and an N-channel MOSFET Q4 is provided to connect the same input of the aforementioned address buffer ADB and another address bus MAB0.

The data buffer (input/output circuit) DB, as representatively illustrated, is connected with a data bus MDB1 or MDB0 by CMOS switch circuits like the aforementioned ones. As to the control signals, a timing generator TG is connected with control (read/write) bus R/W1 or R/W0 by CMOS switch circuits like the aforementioned ones.

Two kinds of fuse circuits are used, corresponding to the buses according to the aforementioned two kinds of function. The fuse circuits are constructed as series circuits respectively composed of one of the fuses F1 and F2 and one of the resistors R1 and R2, although not necessarily limited thereto. The fuses F1 and F2 are made of polysilicon or the like, although not especially limited thereto, and have sufficiently low resistances for the resistors R1 and R2 and are cut (open-circuited) when irradiated with the aforementioned converged ion beam or laser beam.

The voltages at the nodes between the fuse means F1 and the resistor R1 and between the fuse means F2 and the resistor R2 are fed to the gates of the aforementioned P-channel MOSFETs Q1 and Q3, and are inverted through inverters until they are fed to the gates of the N-channel MOSFETs Q2 and Q4.

The aforementioned fuse means F1 and F2 are disposed at the side of the power supply voltage so that they output a high level such as the power voltage so long as they are not cut. As a result, all of the CMOS switch circuits are turned OFF. If the fuse F1, for example, is cut in accordance with the application of the RAM, the corresponding CMOS switch circuit (Q1 and Q2) is turned ON to connect the individual terminals of the RAM, the address bus MAB1, the data bus MD1 and the control bus R/W1. If the fuse F2 is cut, on the other hand, the corresponding CMOS switch (Q3 and Q4) are turned ON to connect the aforementioned same terminals of the RAM to the address bus MAB0, the data bus MD0 and the control bus R/W0.

With this structure, before the fuse means is cut, namely, at the instant when the RAM is completed over the semiconductor wafer, all the CMOS switch circuits corresponding to the respective terminals of the RAM are OFF so that the RAM is in a state isolated from the system. As a result, when the individual terminals of the RAM are equipped with probing test pads, as described above, the RAM itself can have its operations tested instantly. Moreover, the RAM which has been determined from the test result to function properly can be used separately as the calculating or FiFo memory.

Incidentally, in the RAM of FIG. 8, of the address signals received by the address buffer ADB, internal address signals a0 to a8 are fed to the row decoder R-DCR whereas the remaining internal address signals a9 to a13 are fed to the column decoder C-DCR, although not necessarily limited thereto. The row decoder R-DCR decodes the aforementioned address signals a0 to a8 to form a row selecting signal of the word line of a memory array MARY. Here, the row decoder R-DCR should be understood to include the word driver. The column address decoder C-DCR decodes the internal address signals a9 to a13 to form a column selecting signal. A column switch circuit C-SW selects the bit lines of the memory array M-ARY in accordance with the column selecting signal to connect it with the data input/output circuit DB.

The timing generator TG receives the aforementioned control signals R/W and another clock pulse such as a not-shown chip selecting signal to discriminate the operation mode thereby to form a timing signal necessary for the operations. In FIG. 8: a timing signal $\phi x$ is one for selecting the word lines; $\phi y$ designates a column selecting timing signal; $\phi r$ causes the data input/output circuit DB to act as an output circuit; and $\phi w$ causes the data input/output circuit DB to act as an input circuit.

The aforementioned RAM should not be limited to the aforementioned static RAM but may naturally be a dynamic RAM.

Figure 9:
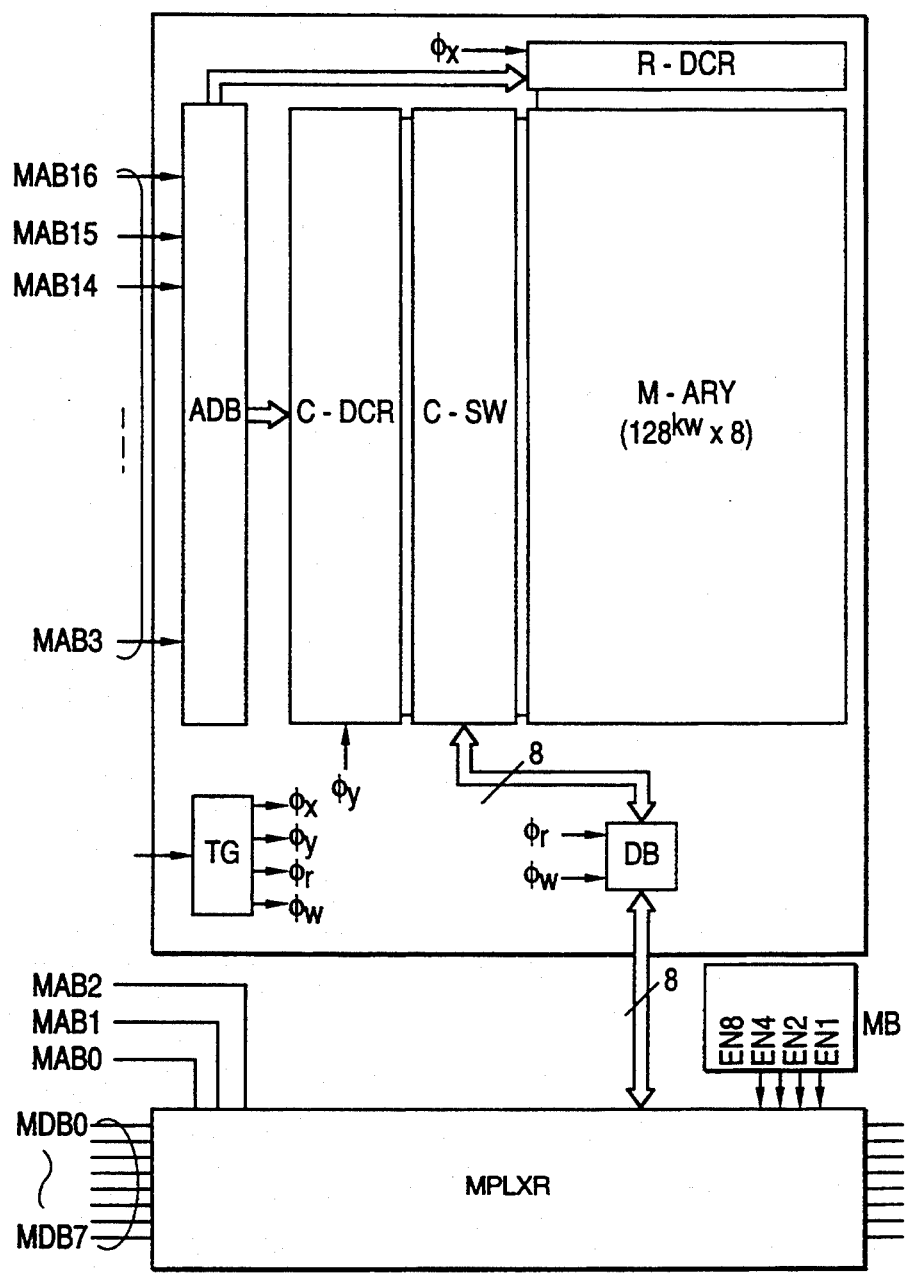
FIG. 9 is a block diagram showing another embodiment of the RAM to be packaged in the large-scale semiconductor integrated circuit device according to the present invention.

FIG. 9 is a block diagram showing another embodiment of the RAM to be packaged in the large-scale semiconductor integrated circuit device according to the present invention.

The RAM of this embodiment is modified from the aforementioned RAM, which is packaged in the large-scale semiconductor integrated circuit device, by adding thereto a bus width varying function so that it may have a versatility. Although not specifically limited thereto, the RAM of this embodiment is caused to read/write the data at a unit of 8 bits and to have a storage capacity of about 128K words (bytes)=about 1M bits. Therefore, the address signals to be fed to the RAM itself are composed of address signals MAB3 to MAB16 of 17 bits. The address signals MAB3 to MAB16 are fed through the address buffer ADB to the aforementioned row decoder R-DCR and the aforementioned column decoder C-DCR. The row decoder R-DCR decodes the aforementioned address signals to select the word lines of the memory array MARY. The column decoder C-DCR decodes the aforementioned address signals to form the signal for selecting the column switch circuit C-SW so that the memory accesses may be performed in units of 8 bits, as described above. In response to this, the input/output circuit disposed in the RAM is caused to input and output the data in parallel as a unit of 8 bits, as described above. In the reading operation, specifically, the data of 8 bits are outputted in response to the signal φr. In the writing operation, on the other hand, the data of 8 bits are inputted in response to the signal φw.

In order to add the aforementioned function to vary the bus width, this embodiment is equipped with a multiplexer MPXR and a memory circuit MB for controlling the former. This memory circuit MB uses a programmable ROM to form signals EN1 to EN8 for selecting the bus width, although not especially limited thereto. If it is necessary to make it possible to set the aforementioned bus width after the circuit such as the RAM has been completed in the semiconductor wafer, the programmable ROM for forming the aforementioned selecting signals EN1 to EN8 may be electrically writable like an EPROM or may use the aforementioned fuse means, although not specifically limited thereto. Alternatively, a memory circuit such as a register may be used to set the bus width of the RAM by means of a software at an initial setting each time the power is applied.

The multiplexer MPLXR receives the aforementioned selecting signals EN1 to EN8 and such ones of address signals MAB0 to MAB2 of lower order bits (least significant bits) as correspond to the bus width, and selectively selects the input/output terminals of 8 bits of the aforementioned RAM with data buses MDB0 to MDB7.

Figure 10:
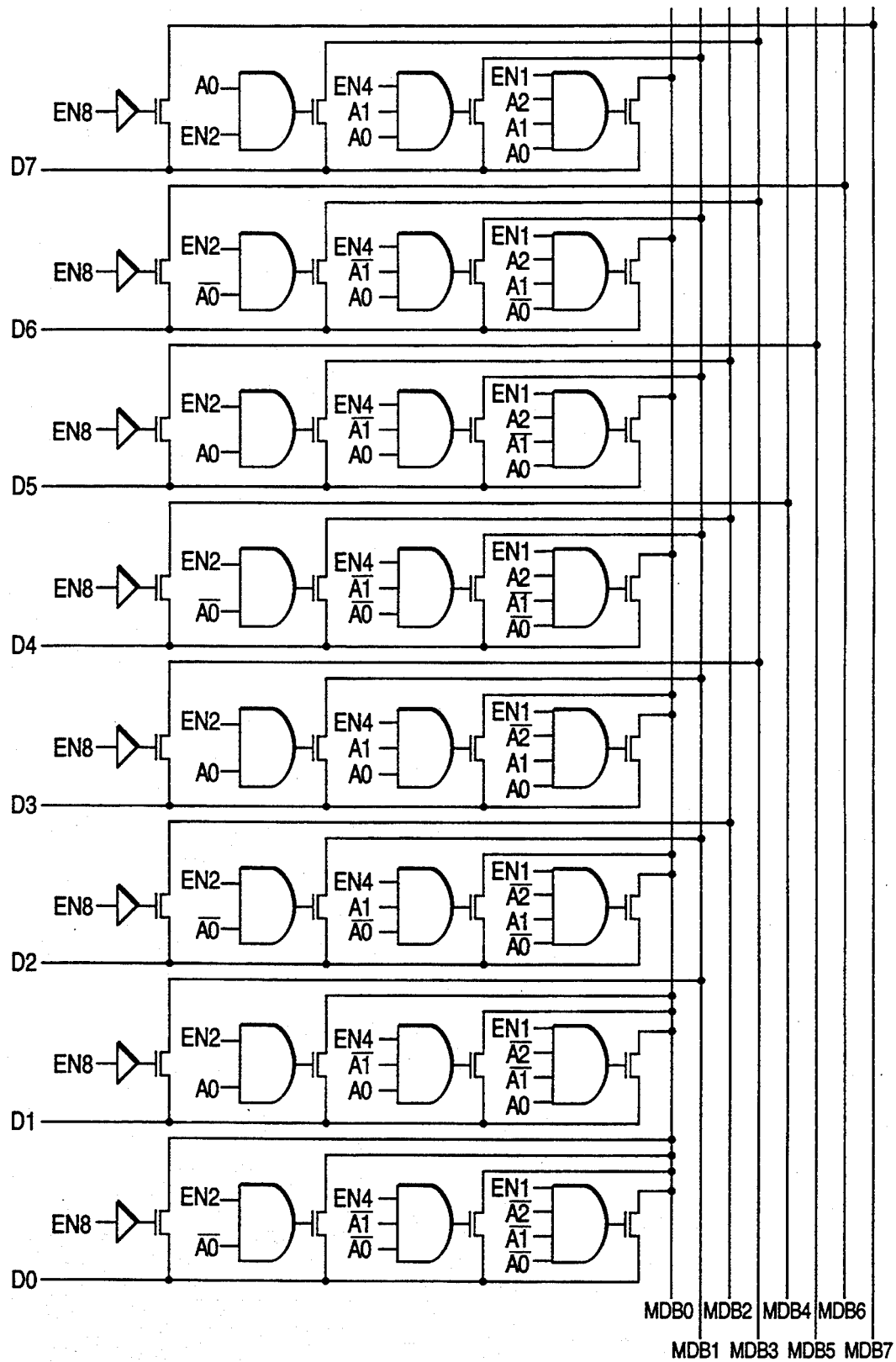
FIG. 10 is a circuit diagram showing one embodiment of the multiplexer to be used in the aforementioned embodiments.

FIG. 10 is a circuit diagram showing one embodiment of the aforementioned multiplexer MPLXR.

The data buses MDB0 to MDB7 and RAM data terminals D0 to D7 are connected with four kinds of switch MOSFETs corresponding to the aforementioned bus width selecting signals EN1 to EN8. The respective gates of the MOSFETs are equipped with selection gate circuits.

The signal EN1 sets the bus width at 1 bit. Therefore, the switch MOSFET corresponding to the signal EN1 is provided to connect one data bus, e.g., .MDB0 and the aforementioned data terminals D0 to D7. The gate of the switch MOSFET corresponding to the data terminal D0 is fed with the decode outputs which are formed by the AND gate circuit fed with the aforementioned signal EN1 and the address signals A0 to A2 of the least significant 3 bits. Specifically, when the address signals A0 to A2 of the aforementioned 3 least significant bits are at the low level, the aforementioned corresponding switch MOSFET is turned ON, the data terminal D0 is connected with the data bus MDB0.

Likewise, the switch MOSFETs corresponding to the aforementioned data terminals D1 to D7 are switched by the decode outputs which are FED with the aforementioned signal EN1, the address signals A0, $\overline{A1}$ and $\overline{A2}$ to A0, A1 and A2. Specifically, when the aforementioned decode outputs are 1 to 7 in decimal notation, the switch MOSFETs corresponding to the data terminals D1 to D7 are turned ON to connect these terminals D1 to D7 with the data bus MDB0.

The signal EN2 sets the bus width at 2 bit. Therefore, the switch MOSFET corresponding to the signal EN2 is provided to connect two data buses, e.g., MDB0 and MDB1 and the aforementioned data terminals D0 to D3 and D4 to D7.

The individual MOSFET switches corresponding to the data terminals D0 to D3 of one group are switched by the decode outputs which are formed by the AND gate circuit fed with the aforementioned signal EN2 and the address signals A0 to A1 of the least significant 2 bits. Specifically, when the aforementioned decode outputs corresponding to the address signals A0 and A1 of the 2 least significant bits are 1 to 3 in decimal notation, the switch MOSFETs corresponding to the data terminals D0 to D3 are turned ON to connect these terminals D0 to D3 with the data bus MDB0. The MOSFET switches corresponding to the data terminals D4 to D7 of another group are switched by the decode outputs which are formed by the AND gate circuit fed with the aforementioned signal EN2 and the address signals A0 to A1 of the 2 least (lowermost) significant bits. Specifically, when the aforementioned decode outputs corresponding to the address signals A0 and A1 of the 2 least significant bits are 1 to 3 in decimal notation, the switch MOSFETs corresponding to the data terminals D4 to D7 are turned ON to connect these terminals D4 to D7 with the other data bus MDB1.

The signal EN4 sets the bus width at 4 bits. Therefore, the switch MOSFET corresponding to the signal EN4 is provided to connect four data buses MDB0 to MDB3 and the aforementioned data terminals D0, D1 to D6, D7. The MOSFET switches corresponding to the data terminals D0 and D1 are switched by the decode outputs which are formed by the AND gate circuit fed with the aforementioned signal EN4 and the address signal A0 of the least significant 1 bit. Specifically, when the address signal A0 is at the low level, the switch MOSFETs corresponding to the data terminals D0 to D6 of even numbers are turned ON to connect the terminals D0 to D6 with the data buses MDB0 to MDB3. Specifically, when the address signal A0 is at the high level, the switch MOSFETs corresponding to the data terminals D1 to D7 of even numbers are turned ON to connect the terminals D1 to D7 of with the data buses MDB0 to MDB3.

The signal EN8 sets the bus width at 8 bits. Since, in this case, the data buses and the data terminals of the RAM are coincident, the switch MOSFETs are provided to connect the data terminals D0 to D7 of the RAM and the data buses MDB0 to MDB7 in a manner to correspond one-to-one. These switch MOSFETs have their gates coupled with the outputs of buffer circuits for receiving the signal EN8. In the case of the buffer circuits being exemplified by inverter circuits, they may be fed at their inputs with an inverted signal EN8.

The aforementioned RAM may be constructed of two subchips for memory access at the unit of ×4 bits. In this case, too, the bus width can be likewise changed by providing a multiplexer MPLXR like the aforementioned one while assuming the two RAMs as the aforementioned RAM. The data bus should not be limited to the aforementioned 8 bits but may take a variety of modes of embodiment such as 16 bits. If it is generally difficult to develop the RAM for the memory access at the unit of 16 bits, generally speaking, two existing data buses of ×8 bits may be used to constitute a RAM of ×16 bits like before, or four RAMs of ×4 bits may be used to handle a RAM of ×16 bits. Thus, the number of bits of the RAM to be packaged may be determined in dependence upon the maximum bus width of the large-scale semiconductor integrated circuit device.

By making the bus width of the RAM variable, as described above, its application can be directed to a variety of data memories such as the data memory of ×8 bits or the data memory of ×4 bits. Since, in this case, the setting of the bus width can be accomplished even after the RAM has been packaged in the semiconductor wafer, the application of the RAM can be determined in accordance with its test results and the aforementioned result of the fault relief. The aforementioned RAM may be either static or dynamic.

Figure 11:
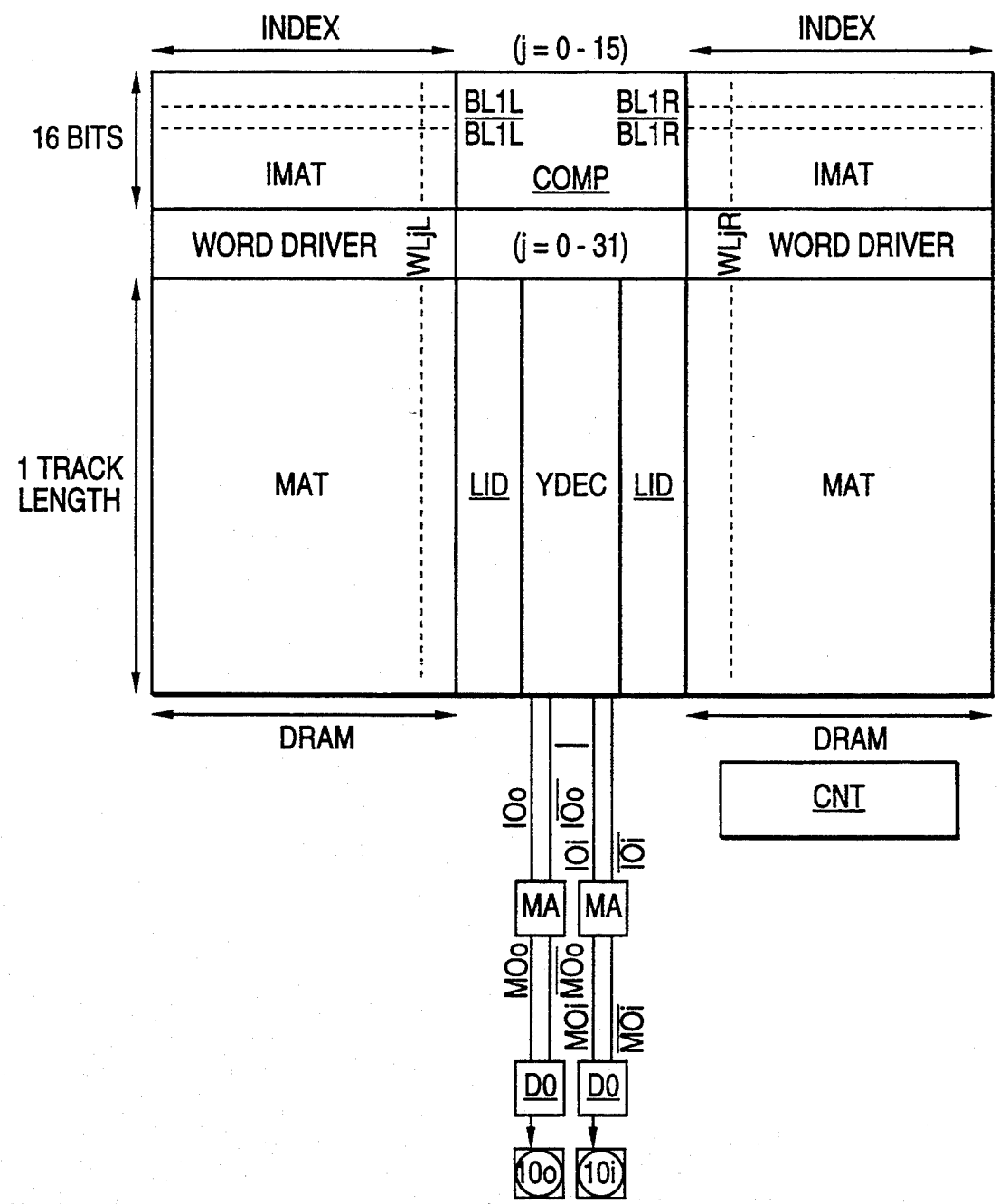
FIG. 11 is a block diagram showing another embodiment of the RAM to be packaged in the large-scale semiconductor integrated circuit device according to the present invention.

FIG. 11 is a block diagram showing another embodiment of the RAM to be packaged in the large-scale semiconductor integrated circuit device according to the present invention.

The RAM of this embodiment has its fundamental structure constructed of a dynamic memory cell array and is additionally given a search function. The memory array in the DRAM of this embodiment has its mats divided asymmetrically by word drivers. A mat IMAT disposed above the word driver is used for indexing and has sixteen memory cells for one word line, although not necessarily limited thereto. On the other hand, a mat MAT disposed below the word driver is connected with a memory cell having one track length. Although not necessarily limited thereto, the indexing mat IMAT and the data mat MAT take a relation similar to that between the index portion of 1 sector and the data portion in a floppy disc.

The aforementioned index mat IMAT is divided in half into the left-hand and right-hand portions by a comparator COMP at the center. Correspondingly, the data mat MAT is also divided in half into the left-hand and right-hand portions by a Y decoder YDEC at the center.

In a manner to correspond to the aforementioned right-hand and left-hand data mats MAT, there are disposed data latches LID each for receiving data of one word line in parallel. This data latch LID accomplishes the parallel/serial conversions for serially inputting and outputting the data D0 to D1 of one track of plural bits as one word. Correspondingly, the data terminals of the RAM are composed of (1 +i) bits IO0 to IOi. Therefore, the main amplifiers MA for amplifying the read signals are provided in the aforementioned (1 +i) bit number.

The RAM of this embodiment is equipped with an address counter CNT for performing the address step-by-step operations for the aforementioned highspeed search function.

Figure 12:
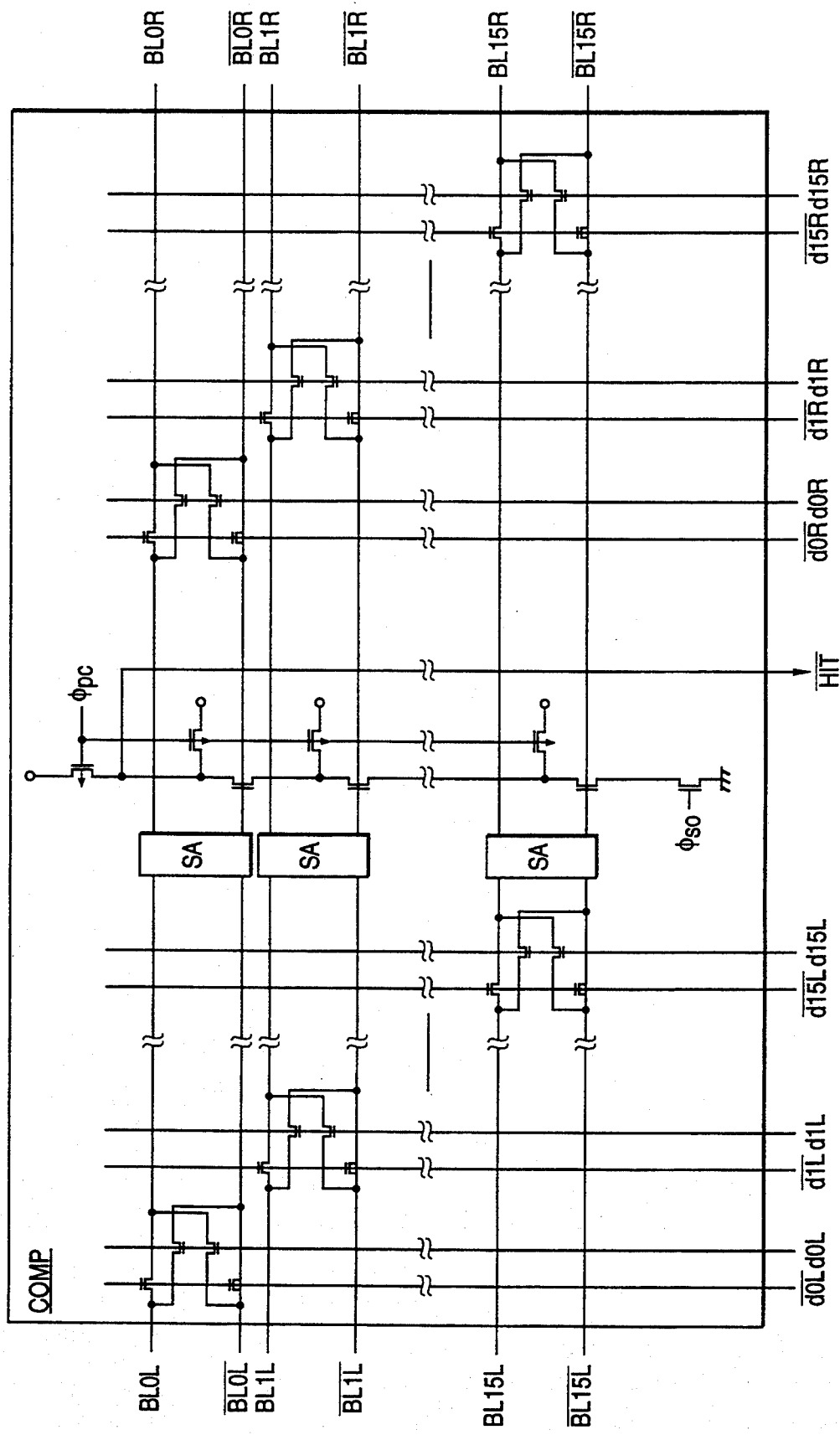
FIG. 12 is a circuit diagram showing one embodiment of the comparator to be packaged in the aforementioned RAM.

FIG. 12 is a circuit diagram showing one embodiment of a comparator COMP used in the aforementioned RAM.

In this embodiment, the comparator function is added by making use of the switch MOSFETS for selecting the sense amplifiers. Specifically, between a pair of complementary bit lines BL0L, $\overline{BL0L}$, to BL15L, $\overline{BL15L}$ arranged in parallel with the indexing left-hand mat IMAT and the corresponding sense amplifiers SA, there are interposed the sense amplifier selecting switch MOSFETs. In order to add the comparison functions to the switch MOSFETs, there are provided the MOSFETs for connecting the aforementioned complementary bit lines BL0L, $\overline{BL0L}$ to BL15L, $\overline{BL15L}$ as they are with the input/output nodes of the sense amplifiers SA. These MOSFETs have gates fed with inverted input signals $\overline{d0L}$ to $\overline{d15L}$ acting as shared selection signals and to be compared. There are also provided MOSFETs which are connected with the input/output nodes of the sense amplifiers SA by vertically interchanging the aforementioned complementary bit lines BL0L, $\overline{BL0L}$ to BLI5L, $\overline{BL15L}$. These MOSFETs have their gates fed with non-inverted input signals d0L to d15L acting as the shared selection signals which signals are to be compared.

Like the aforementioned structure, there are disposed MOSFETs for connecting the paired complementary bit lines BL0R, $\overline{BL0R}$ to BL15R, $\overline{BL15R}$, which are arranged in parallel with the indexing righthand mat IMAT, with the input/output nodes of the aforementioned common sense amplifiers SA. These MOSFETs have acting as the shared selection signals which signals are to be compared. By vertically interchanging the aforementioned complementary bit lines BL0R, $\overline{BL0R}$ to BL15R, $\overline{BL15R}$, moreover there are also provided MOSFETs which are connected with the input/output nodes of the aforementioned common sense amplifiers SA. These MOSFETs have their gates fed with the non-inverted input signals $\overline{d0R}$ to $\overline{d15R}$ acting as the shared selection signals which signals are to be compared.

Of the aforementioned comparative input signals d0R to d15R, although not specifically limited thereto, the original input signals d0 to d15 of 16 bits are the aforementioned two series of signals in response to the Y-address signals for selecting the aforementioned right-hand and left-hand mats. The signals corresponding to the mats of the unselected side turn the corresponding MOSFET switches into the OFF state when all of them are set at the low level. As a result, the sense amplifiers are connected with the mats at the selected sides.

If the input signal d0L to be compared is at the high level (i.e., the logic level "1") when the left-hand indexing mat IMAT, for, example, is selected, the corresponding bit lines BL0L and $\overline{BL0L}$ are vertically interchanged and connected with the input/output nodes of the sense amplifiers SA. If, therefore, the same logic "1" is stored in the memory cell, the level of the lower side (i.e., the side of the inverted bit lines) of the sense amplifiers SA takes the high level. If the memory cell is stored with the logic "0" the level of the low side of the sense amplifiers SA takes the low value. In order to decide whether or not the aforementioned coincidence is for all bits, there is provided in series a plurality of N-channel MOSFETs which are respectively made receptive of input/output signals corresponding to the aforementioned individual sense amplifiers SA. This series connection of MOSFETs provides at one end thereof (drain end side), an output terminal HIT, and the node between the output and a supply potential and between the supply potential and the respective drains of each of the N-channel MOSFETs is provided with a corresponding P-channel precharge MOSFET which is responsive to precharge pulses $\phi pc$. Between the other end of the aforementioned series connection of N-channel MOSFETs and the ground potential point, there is interposed an N-channel discharge MOSFET which is switched by timing pulses $\phi sa$ which is generated in synchronism with the amplifying portion of the sense amplifiers SA operation. If all the output signals of the sense amplifiers SA are coincident at the high level, as described above, all the aforementioned series MOSFETs are turned ON to form the high output signal HIT at the low level. If there is disagreement even with one bit (no coincidence of all the bits), a discharge path is not formed in the aforementioned series connection of MOSFETs so that the output signal $\overline{HIT}$ takes the high level. This likewise applies to the case in which the indexing memory mat MAT at the righthand side is selected.

Figure 13A:
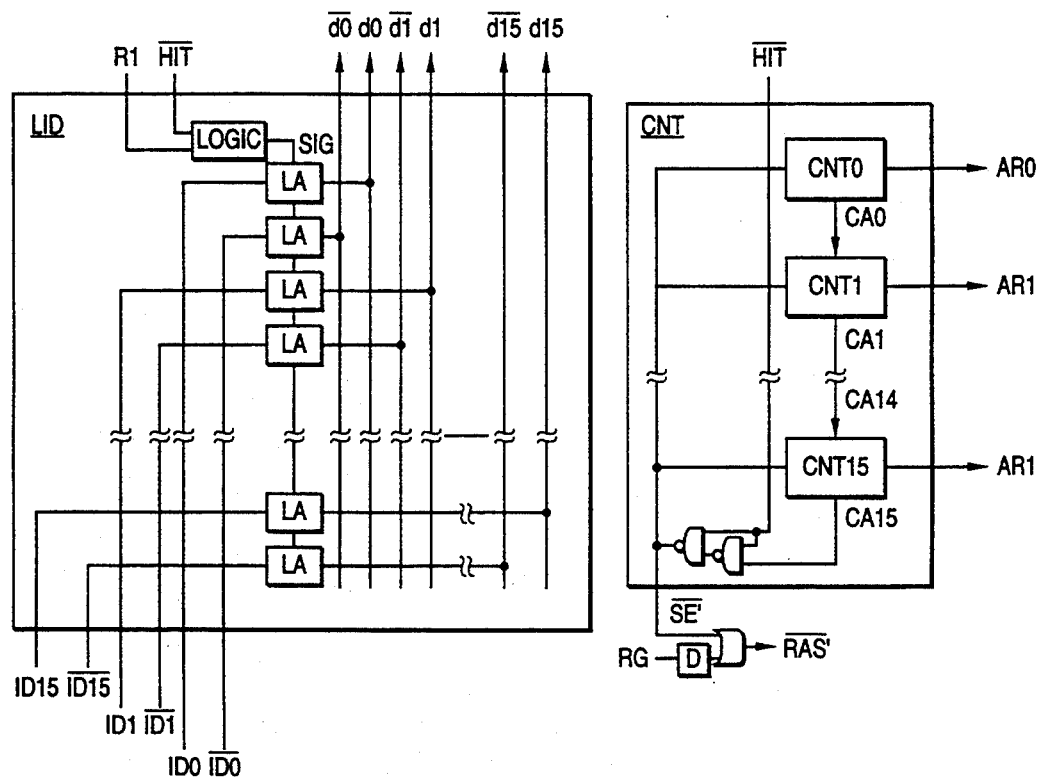
FIGS. 13(A), 13(B) and 13(C) are is a circuit diagram showing one embodiment of the latch circuit and its unit circuit, the address counter and the data output circuit to be packaged in the aforementioned RAM.
Figure 13B:
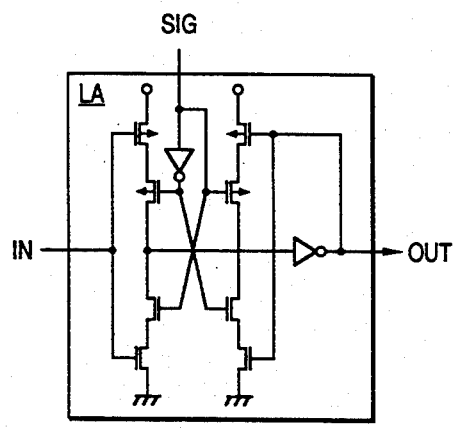
Figure 13C:
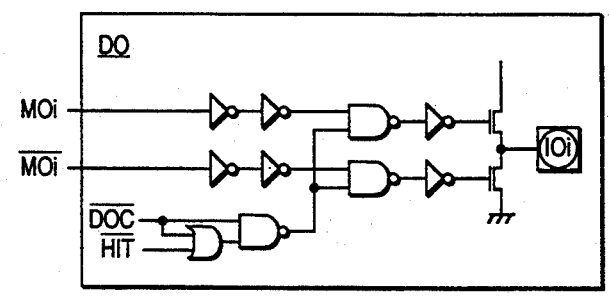

FIGS. 13 (A), 13(B) and 13(C) circuit diagrams showing embodiments of the latch circuit LID shown in FIG. 11, its unit circuits LA, an address counter and a data output circuit DO.

The latch circuit LID is constructed, as shown by its unit circuit LA, of, inputting clocked inverter circuits which receive input signals at their input terminals IN, static inverter circuits, and feedbacking clocked inverter circuits interposed between the inputs and outputs of the former. The inputting and feedbacking clocked inverter circuits are operated in a complementary manner in accordance with a control signal SIG. Specifically, if this control signal SIG is at the high level, the inputting clocked inverter circuits are set in their operative state, whereas the feedbacking clocked inverter circuits are set in their output high-impedance state to receive the incoming signals at the input terminals. If the control signal SIG is at the low level, the inputting clocked inverter circuits are set at their output high-impedance state whereas the feedbacking clocked inverter circuits are set at their operative state to effect a latching operation of the aforementioned received signals.

The aforementioned SIG is formed of the row timing signal R1 and the hit signal $\overline{HIT}$ and latches the data of one word line at the mat of the data unit when the index data are coincident. In the case of a mishit, the corresponding data are incontinently passed through.

The address counter circuit CNT is constructed of binary counter circuits CNT0 to CNT15 to form row address signals AR0 to AR15 of the aforementioned RAM. The carry signal CA15 of the counter circuit CNT 15 at the most significant bit and the hit signal $\overline{HIT}$ are fed to a logical gate circuit, whose output signal $SE'$ effects the address step-by-step operations in the case of a mishit. When the counter overflows, the address counter circuit CNT forms a signal $\overline{RAS'}$ for resetting the RAM from the delay signal of a signal RG.

The data output circuit DO is representatively illustrated as a circuit of 1 bit and is rendered operative by both an output control signal DOC generated in the read mode and the aforementioned hit signal $\overline{HIT}$, to output a signal fed from its input MO1 to the outside.

Figure 14:
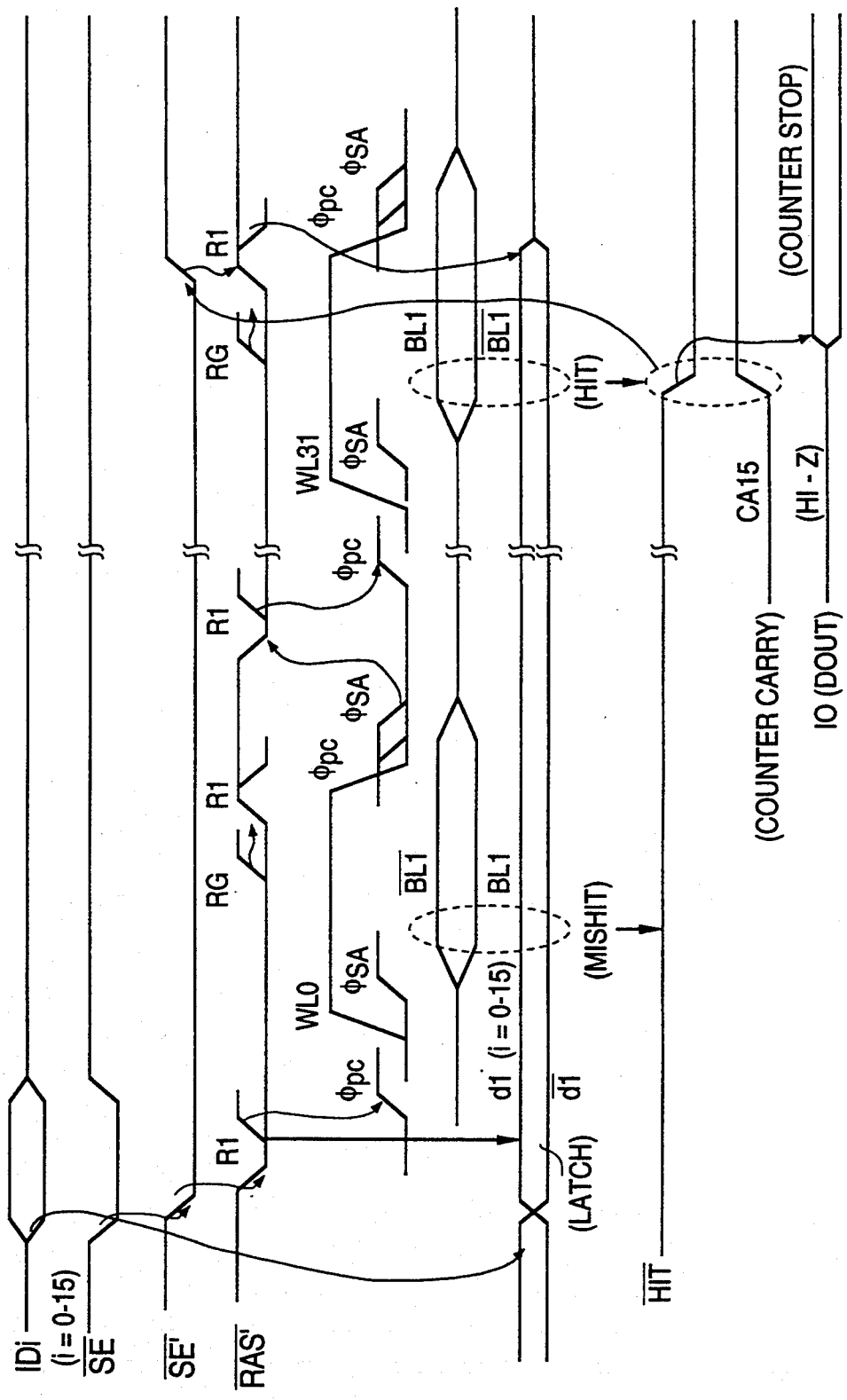
FIG. 14 is a waveform chart for explaining one example of the operations of the aforementioned RAM, respectively.

FIG. 14 presents a waveform chart for explaining one example of the operations of the aforementioned RAM.

If a search enable signal $\overline{SE}$ is at the low level, the search mode is entered. In synchronism with the low level of the signal $\overline{SE}$, index data IDi are inputted and latched in a not-shown latch circuit. In response to the low level of the internal signal $\overline{SE'}$ formed at the low level of the aforementioned search enable signal $\overline{SE}$, the internal $\overline{RAS'}$ signal is dropped to the low level so that the row selecting operations are accomplished in response to the search address signal formed by the address counter circuit CNT. As a result of the row selecting operations, the comparing operations are accomplished by the aforementioned comparator COMP. In the case of a mishit, a resetting is accomplished in response to a delay signal of the signal RG to effect the precharge operations of the internal circuit. Simultaneously with this, the address step-by-step operations are accomplished to effect the selecting operations of a next word line.

FIG. 14 shows an example, in which the mishits continue like the aforementioned operations so that the index information read out by the selecting operations of the 31th word line WL31 and the aforementioned input index information are coincident. When the hit signal $\overline{HIT}$ is at the low level, the internal search enable signal $\overline{SE'}$ is reset to the high level so that the data of the data unit are introduced into the latch circuit LID until they are serially outputted from an output terminal IO. If all the index informations are mishit, a similar resetting is accomplished by a counter carrier signal CA15. At this time, the output terminal 10 is left at the high impedance.

Since, in the RAM of the aforementioned embodiment, the mat IMAT of the index unit is connected with only sixteen memory cells, the selecting operations of the word lines are accomplished at a high speed. Therefore, the reading operations of the index unit can be accomplished at a far higher speed than those of the data unit in which a number of memory cells are coupled to one word line. Simultaneously with this, the memory cells of the data unit accomplish the reading operations. During these operations, the mat IMAT of the index unit can finish the operation of comparing whether or not the index data of the stored information are coincident. As a result, the high-speed searching operations can be realized.

In the case where a dynamic memory cell is used with respect to the above-said RAM, the information charges stored in the information storage capacitor by the selecting operations of the word lines can be destroyed by a resulting charge sharing with the bit line capacitances. This makes it necessary to implement the sense amplifier with amplication capability thereby to return the storage capacitors to the stored charges. The signal RG is a timing signal for ensuring the rewrite to generate the reset signal R1, as described hereinbefore.

In the case where the memory array is constructed of the static memory cells, the aforementioned rewrite operation of the memory cells is unnecessary so that the operations can be immediately shifted to the switching of the word lines in response to the aforementioned decision result of the comparator. In case this static RAM is used, the search can be effected at a higher speed.

The data stored in the aforementioned latch circuit LID are serially outputted as a data unit of 16 bits by the Y-address selector.

Incidentally, the row selecting circuit is required for writing data in the index part or the data part. In order to simplify the circuit, the aforementioned counter circuit can be controlled by the clock coming from the outside of the subchips so that its address signal may be used. If the external data terminals are of 16 bits, as described above, the input is effected as a data unit of 16 bits and is converted into serial data by the Y-address selecting circuit associated with the Y-decoder YDEC until it is fed to the aforementioned latch circuit LID, so that the data stored in the latch circuit may be written as a whole at the unit of one word line in the word lines selected in accordance with the aforementioned row address signal. Simultaneously with this, the word lines of the index unit are selected, and the corresponding index data may be simultaneously written from the aforementioned input terminals of 16 bits. The RAM having the high-speed searching mechanism of this embodiment can be used in various applications such as for the file locations.

Figure 15:
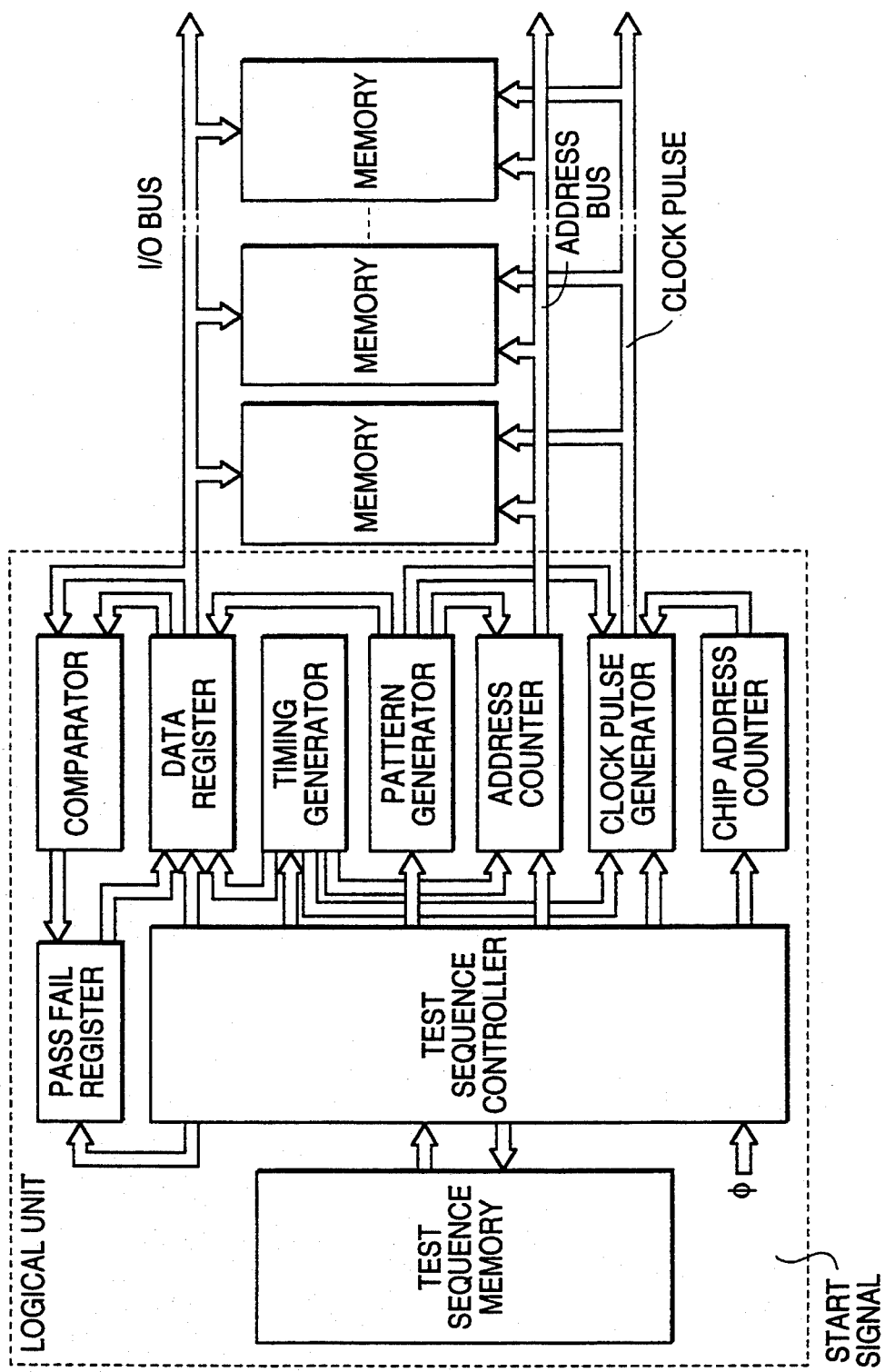
FIG. 15 is a block diagram showing one embodiment of the test circuit of the RAM to be packaged in the large-scale semiconductor integrated circuit device according to the present invention.

FIG. 15 is a block diagram showing one embodiment of a RAM testing circuit to be packaged in the largescale semiconductor integrated circuit device according to the present invention.

In the large-scale semiconductor integrated circuit device to be packaged with the numerous subchip RAMs as in this embodiment, the operation tests of the subchips can be accomplished relatively easily by providing testing pads at the wafer probing step, as described above.

After one large-scale semiconductor integrated circuit device has been completed, however, the operation tests of the numerous subchip RAMs are performed by using the external terminals disposed in the aforementioned interface I/0. As a result, the RAMs constituting the aforementioned FiFo memory or calculating memory can only be accessed indirectly, wherein the formation of the test patterns is troublesome, and the testing takes a long time. Moreover, the aforementioned large-scale semiconductor integrated circuit device itself constitutes a relatively large-scale information processing system. This makes it necessary to accomplish the memory tests for maintaining the effectiveness even when the device has already been used by the user.

Therefore, the large-scale semiconductor integrated circuit device of this embodiment has an additional self-testing circuit, as will be described in the following. This testing circuit is built in the aforementioned logical unit. The individual testing operations for realizing the various testing functions by the logical unit of a relatively small circuit scale are performed by a software, although not necessarily limited thereto. The test sequence memory stores the testing program. Although it is not necessarily limited thereto, this test sequence memory is constructed of a RAM and is written with a test program prepared in advance from the outside. If this structure is changed by fixing the test functions, the aforementioned test sequence memory may be constructed of a ROM or the like.

The test sequence controller is started by a start signal $\phi$ so that the execution of the test program stored in the aforementioned test sequence memory is started in accordance with the test program itself.

The test sequence controller initializes a chip address counter, an address counter, a data register and a pass fail register and sets test information in a timing generator and a pattern generator.

The clocked pulse generator feeds clock pulses ($\overline{RAS}$, $\overline{CAS}$, $\overline{WE}$, $\overline{CE}$, $\overline{OE}$ and so on) to the memory to be tested, in accordance with the instructions from the chip address counter, the timing generator and the pattern generator.

The address counter feeds address signals to the memory to be tested, in accordance with the instructions of the timing generator and the pattern generator.

The data register feeds data to be written to the memory to be tested, in accordance with the instructions of the timing generator and the pattern generator.

The comparator compares the data read out from the memory in the reading operations and the written data latched in the data register and feeds the propriety decision result to the pass fail register.

In order to reduce the capacity of the pass fail register, according to this embodiment, although not necessarily limited thereto, the fail information of the propriety decision result introduced into the fail register is written through the data register as a later-described bad flag in the memory being tested. The memories as the built-in subchips are sequentially tested by repeating similar operations.

The test circuit of this embodiment is used not only at the aforementioned final testing step but also for maintaining the effectiveness of the device for the user, if necessary. Therefore, the tests to be accomplished for the benefit of the user may be simplified even more so than the tests performed at the aforementioned final testing step of the development of the device. If the RAM is used as the test sequence memory as in the aforementioned embodiment, the test content can be easily changed without increasing the memory capacity.

Figure 16:
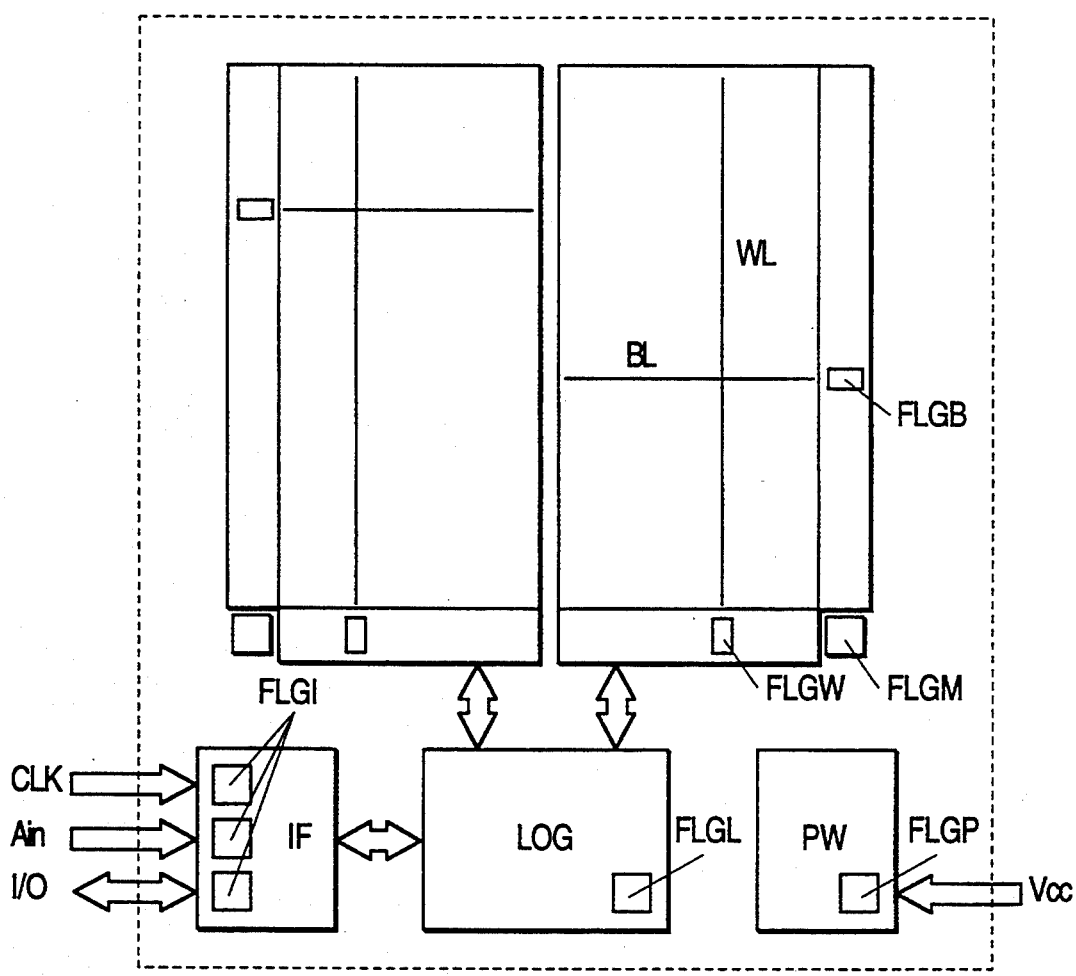
FIG. 16 is a circuit diagram showing one embodiment of the memory circuit corresponding to the aforementioned test circuit.

FIG. 16 is a block diagram showing one embodiment of the memory circuit corresponding to the aforementioned self-test circuit.

The memory is equipped with flags for latching the aforementioned test results. For example, flags FLGI are provided for an interface unit IF responding to a clock CLK, an address signal Ai and a data I/0. If this interface unit IF is defective, the flags FLGI are set. These flags FLGI are composed of a plurality of bits corresponding to the defective portions of each of the aforementioned circuit, although not necessarily limited thereto. A logical circuit unit LOG which receives the signal from the interface unit IF is also equipped with a similar flag FLGL. The logical circuit unit LOG instructs the operation mode of the memory circuit and generates the timing signal. Therefore, the flag FLGL of the logical circuit unit LOG is composed of a plurality of bits corresponding to the individual functions.

A power supply circuit PW is one for supplying the power voltage to the memory circuit and is equipped with a flag FLGP to be stored with a DC defect.

Moreover, the memory array unit is equipped with not only a flag FLGM for storing a defect of its selected circuit but also flags FLGW and FLGB at the unit of the word line or the bit line, although not necessarily limited thereto, in the RAM which is used as a serial memory by the stepwise advance of the address signal.

These flags FLGW and FLGB have their data terminals connected with the common signal lines, which carry data in accordance with one-by-one selections of the word lines and bit lines, and which flags are selected by the selection signals of the aforementioned word lines and bit lines, for example. Since, in this structure, flags are simultaneously selected one by one for the word and bit lines selected in the aforementioned self test, the logic "1" may be inputted to the aforementioned signal lines if a defect occurs.

If, in the ordinary operation mode, there is set the bit indicating a defect that the content of the flag FLGW or FLGB of the word or bit line selected is at the logic "1" the selecting operations of the word or bit line are skipped to the subsequent word or bit line. Since there is added the function to skip the selecting operations in accordance with the content of the flags FLGW and FLGB, the selecting operations of the defective word or bit line are not performed so that the function can be used as the fault relieving function.

If the memory performing the random access is selected from the logic circuit unit, it is sufficient to decide whether each of the aforementioned flags is read out before the memory is accessed or before the memory cell of the address is to be accessed.

Figure 17:
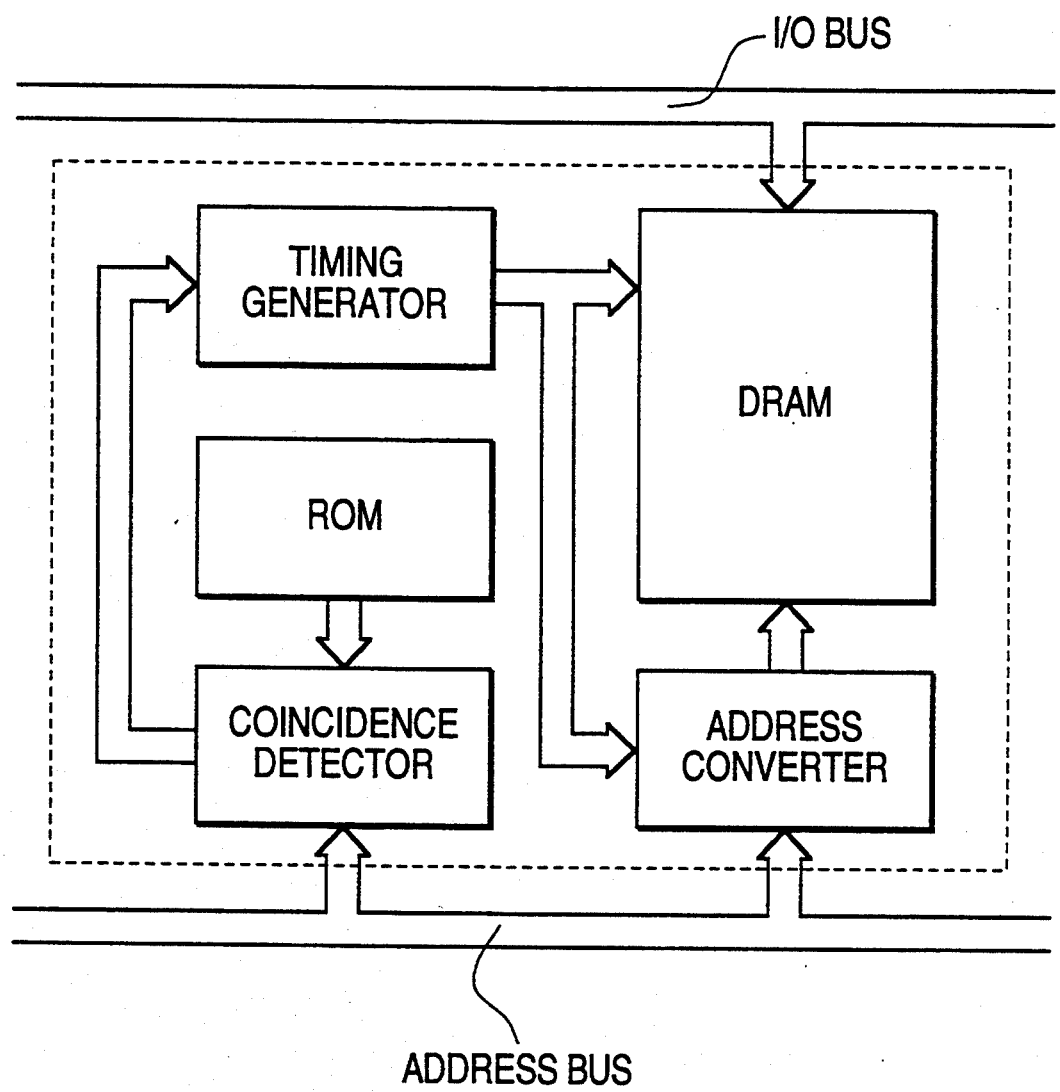
FIG. 17 is a schematic block diagram for explaining one embodiment of the fault relieving method in the large-scale semiconductor integrated circuit device according to the present invention.

FIG. 17 is a schematic block diagram for explaining one embodiment of the fault relieving method of the large-scale semiconductor integrated circuit device according to the present invention.

In the memory fault relieving method of the prior art, the memory cell array is equipped with a preparatory memory cell array so that a memory access to a defective portion may be switched to the above-specified preparatory memory cell array. For this, there is provided a redundancy address comparator circuit. In case the preparatory memory cell arrays are prepared for the row and column systems, they are accompanied by redundancy address comparator circuits.

What can be relieved by the aforementioned fault relieving method of the prior art is limited to the number of faults it can relieve to either that corresponding to the available redundancy word lines or redundancy bit lines or that of the redundancy address comparator circuit. If, therefore, the occurrence of defective portions exceeds the number of the aforementioned redundancy circuits, the relief thereof cannot be effected, and the defective chips have to be isolated from the system.

The fault relieving method of this embodiment overcomes this limitation by facilitating the use of a memory area which exists even in the defective chip which otherwise could not be relieved by a fault relieving method such as that of the prior art.

If a defective word line or bit line is present in the DRAM, the addresses become so discrete that they are difficult to use. Therefore, the DRAM of this embodiment is equipped with an address converter.

Since the plural DRAMs having defective addresses are used to constitute one memory having continuous addresses, there is provided a ROM for storing the system address assigned thereto. This ROM is adapted to store the maximum and minimum values. A coincidence detector compares the address range set in the aforementioned ROM and the system (external) address signal fed from the address bus, to generate a substantial chip selection signal. In response to this signal, a timing generator for controlling the internal operations starts its memory accessing operations in accordance with the converted addresses.

Here will be described an example of the fault relief, in which five (No. 1 to No. 5) dynamic RAMs having a storage capacity of about 1 Mbits including the internal defective bits are combined to provide an equivalent dynamic RAM having a storage capacity of about 4 Mbits.

For example, if the subchip No. 1 has an operation bit number of 1,006 Kbits and if the inside is divided for one block of 2 Kbits, the operation block number is 503 (503×2K=1,006K). As a result, the external address borne in this subchip No. 1 corresponds to 0 to 502 in decimal notation so that the minimum and maximum addresses to be stored in the ROM are 0 and 502, respectively.

If the operation bit number is 1,000 Kbits, the operation block number for the subchip No. 2 is 500. As a result, the external address borne in this subchip No. 2 corresponds to 503 to 1,002 in decimal notation so that the minimum and maximum addresses to be stored in the ROM are 503 and 1,002, respectively.

If the operation bit number is 990 Kbits, the operation block number for the subchip No. 3 is 495. As a result, the external address borne in this subchip No. 3 corresponds to 1,003 to 1,497 in decimal notation so that the minimum and maximum addresses to be stored in the ROM are 1,003 and 1,497, respectively.

If the operation bit number is 870 Kbits, the operation block number for the subchip No. 4 is 435. As a result, the external address borne in this subchip No. 4 corresponds to 1,498 to 1,932 in decimal notation so that the minimum and maximum addresses to be stored in the ROM are 1,498 and 1,932, respectively.

For the subchip No. 5, in case the aforementioned memory of about 4 Mbits is constructed, the residual may be 230 Kbits. As a result, even if there exist the operation bits of about 1,000 Kbits, the operation bits are 230 so that 115 blocks are assigned. The external address borne in this subchip No. 5 corresponds to 1,933 to 2,047 in decimal notation so that the minimum and maximum addresses to be stored in the ROM are 1,933 and 2,047, respectively.

Since the DRAM is divided into the plural blocks, the bit number of the address signals for the address conversion is as small as 9 bits even if the external addresses are designated at 0 to 2,047 (11 bits), as described above. It should be understood that the address signals of the most significant 2 bits composed of 11 bits be decoded by the aforementioned ROM and coincidence detector.

Figure 18:
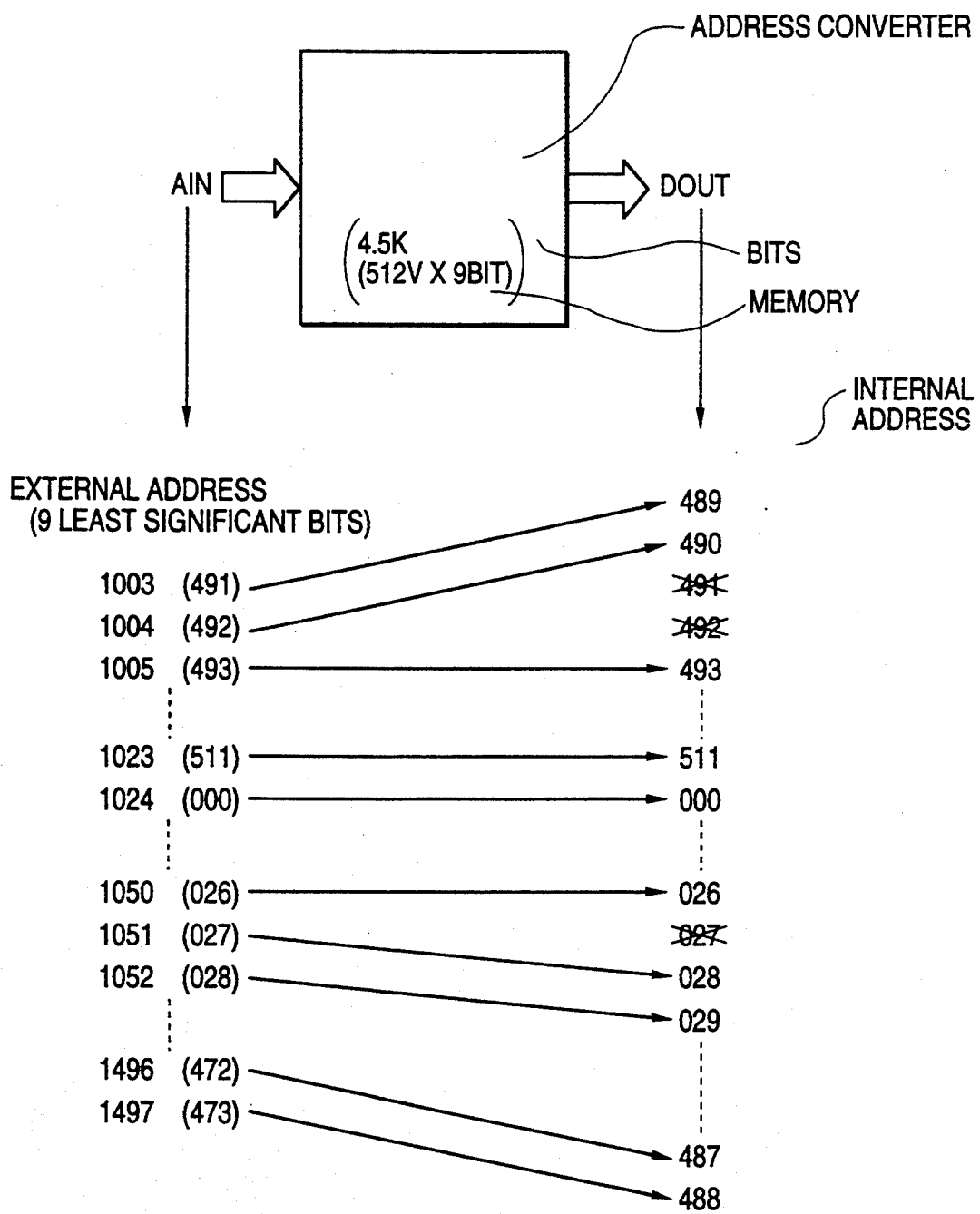
FIG. 18 is a conceptional diagram showing one example of the structure of the address converter and the address conversion.

FIG. 18 shows one example of the structure of the address converter and its address conversion.

The address converter is constructed of a memory having a capacity as small as 512 words ×9 bits (4.5 Kbits). Of the external addresses of 11 bits, more specifically, the addresses of the 9 lowermost significant bits are fed as an address signal Ain to be converted, and the address designated thereby is stored with the converted address signal of 9 bits. The address converter designates the block address of the DRAM with its read-out signal Dout.

The memory circuit constituting the aforementioned address converter has to be written with the address-converted data in accordance with the propriety decision result (indicative of whether a malfunction is present) by the operation test after the circuit has been completed over the semiconductor wafer. Therefore, the memory circuit is conveniently exemplified by an electrically programmable EPROM as well as a RAM. In the latter case using the RAM, the aforementioned defective content has to be filed thereby to write the address conversion content each time the power supply is made.

The aforementioned structure of the address converter likewise applies to the ROM for storing the minimum and maximum of the aforementioned address. However, the aforementioned ROM stores the minimum and maximum of the aforementioned external address of 11 bits so that fuse means can be used in place of the aforementioned structure. This ROM and the coincidence detector may be omitted to adopt the structure in which the external addresses of 11 bits are converted while being corresponded to the aforementioned internal addresses of 9 bits.

Incidentally, 2 Kbits are designated for the DRAM by the aforementioned one block address. In case the memory access is accomplished at the unit of ×8 bits (1 byte), for example, the address designations by the address signal of the 8 lowermost significant bits are accomplished to designate 250 bytes. In case the memory access is to be accomplished at the unit of ×4 bits, the address designations are accomplished by the address signal of the 9 lowermost significant bits for the aforementioned external address.

The example of the address conversion represented in FIG. 18 corresponds to the foregoing subchip No. 3.

The subchip No. 3 has the operation bit number of 990 Kbits, as has been described above, and is caused to perform the following address conversion in response to the external addresses 1,003 to 1,497 by the aforementioned ROM and coincidence detector. In FIG. 18, in a manner to correspond to the addresses 1,003 to 1,497 designated by the external addresses of 11 bits, the parenthesized addresses (491 to 511 and 000 to 473) are expressed in decimal notation by the 9 lowermost significant bits to be actually converted.

In order to reduce the discrepancy of the internal addresses to be converted from the external addresses, although not specifically limited thereto, the address conversions are accomplished such that the aforementioned external address 000 of 9 bits conform to the internal address 000 of 9 bits. If the internal address 027 is defective, the internal addresses 000 to 026 are not converted but left as they are in a manner to correspond to the external addresses 000 to 026. Since, moreover, a defect exists in the 2 Kbits designated by the internal address 027, the external address 1,052 (027) is converted to the internal address 023. Then, the external address 1,053 (028) is converted by one address to the internal address 029. Since the internal addresses having a defective bit, as described above, is excluded, the internal address corresponding to the final address 1,497 (473) is converted to 488.

As a result, the minimum address 1,003 (491) of the external system address is converted to the internal address 489. The subsequent address conversions are accomplished likewise. If defective bits exist in the internal addresses 491 and 492, as shown, the external address 1,005 (493) is so converted to the internal address 493 (not converted as a matter of fact)as to exclude the defective bit. If no defective bit is present, the addresses (493 to 511) designated by the 9 lowermost significant bits of the external address are equal to the converted internal addresses 493 to 511.

As a result, the subchips of about 5M bits containing the defective bits can be combined, as described above, so that they can be reproduced as memories having a storage capacity of about 4 Mbits.

The address converter should not be limited to that for converting all the addresses by using the aforementioned memories but may be one for forming address signals of predetermined bit pattern if a specific defective address is detected. In this case, only those corresponding to the defective addresses are converted into other addresses.

One memory block is set at 2 Kbits, as in the foregoing embodiment. Then, if the memory access is accomplished at the unit of ×8 bits (1 byte), the storage capacity left is only 250 bytes. If, on the other, hand, the address designations are to be accomplished by the address signal of the 8 lowermost significant bits, addresses 251 to 255 are left empty. As a result, it is convenient to set one memory block at $2^N$ (N: an integer) such as 2,048 bits. Then, data of ×8 bits are present in all the addresses designated by the address signal of the 8 lowermost significant bits. This also applies to the case in which the address designations are accomplished by the use of the address signal of the 9 lowermost significant bits for the memory access at the unit of ×4 bits.

By thus reproducing one memory circuit equivalently with the subchip having its defective portion left, one of five subchips can be deemed as having been disposed as defective from the outside of the large-scale semiconductor integrated circuit device. Since the good semiconductor memory device can thus be more readily and economically obtained from the five memory chips, in connection with the memory capacity requirements discussed, it becomes possible to reduce the number of subchips which must be prepared in advance and provided for relieving the probable occurrence of a defect. In other words, the substantial degree of integration can be enhanced. The large-scale semiconductor integrated circuit device, which might otherwise not be usable as a result of the number of defects present exceeding the capability of the device to implement relief thereof, such as in the prior art, can, in fact, be used effectively as completely movable devices in accordance with that described above, thereby making it possible to enhance the production yield of the expensive large-scale semiconductor integrated circuit device.

Figure 19:
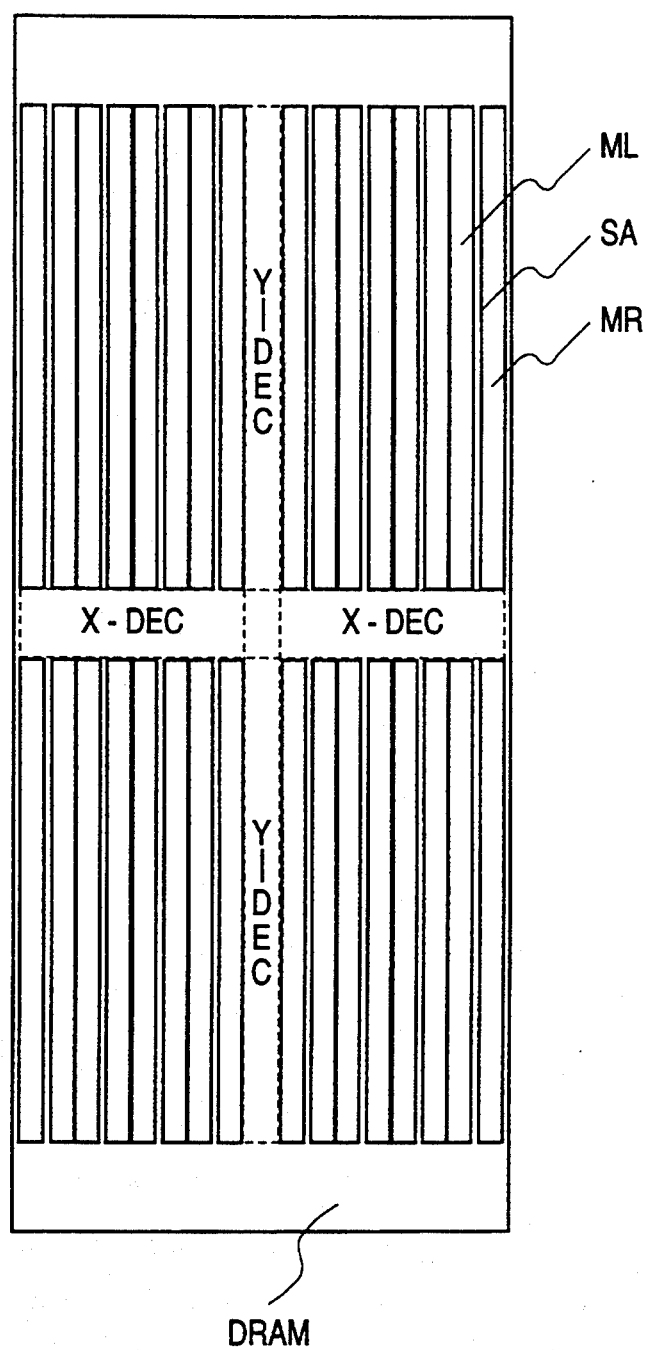
FIG. 19 is a layout showing the schematic inside of one embodiment of the dynamic RAM to be packaged in the large-scale semiconductor integrated circuit device according to the present invention.

FIG. 19 is a schematic internal layout showing one embodiment of the dynamic RAM to be packed in the large-scale semiconductor integrated circuit device according to the present invention. This DRAM, as shown, is made to have a memory capacity of about 4 Mbits. The subchip is arranged at its longitudinal center with Y-decoders YDEC and at its transverse center with X-decoders XDEC. Thus, the memory array unit is roughly divided into four quarters, each of which is made to have a storage capacity of about 1 Mbits. A unit memory mat is composed of memory mats ML and MR which are transversely divided across the sense amplifier SA. Therefore, these memory mats ML and MR across the sense amplifier SA are made to have a storage capacity of about 256 Kbits. As a result, each memory array unit thus quartered, as shown, is arranged with four sense amplifiers and corresponding four pairs of memory mats.

Let the case of a DC defect be considered in which either the two electrodes of a capacitor of the memory cell in the memory mat or the paired bit lines are shorted. Since the fault relieving method of the prior art avoids the access to the defective portion, the DC defect is left even after the write/read defects are replaced by the redundancy memory cells. Since, moreover, this DC defect causes an increase in the power consumption of the system, a reduction in the input/output levels and an increase in power source noises, it has to be completely isolated from the system by the aforementioned converged ion beam or laser beam.

In the DRAM having the aforementioned large storage capacity, however, the DC defect exists merely in one memory mat. Therefore, we have conceived to isolate the aforementioned DC defect, if any, by circuit means so that the remaining circuits may still be used.

Figure 20:
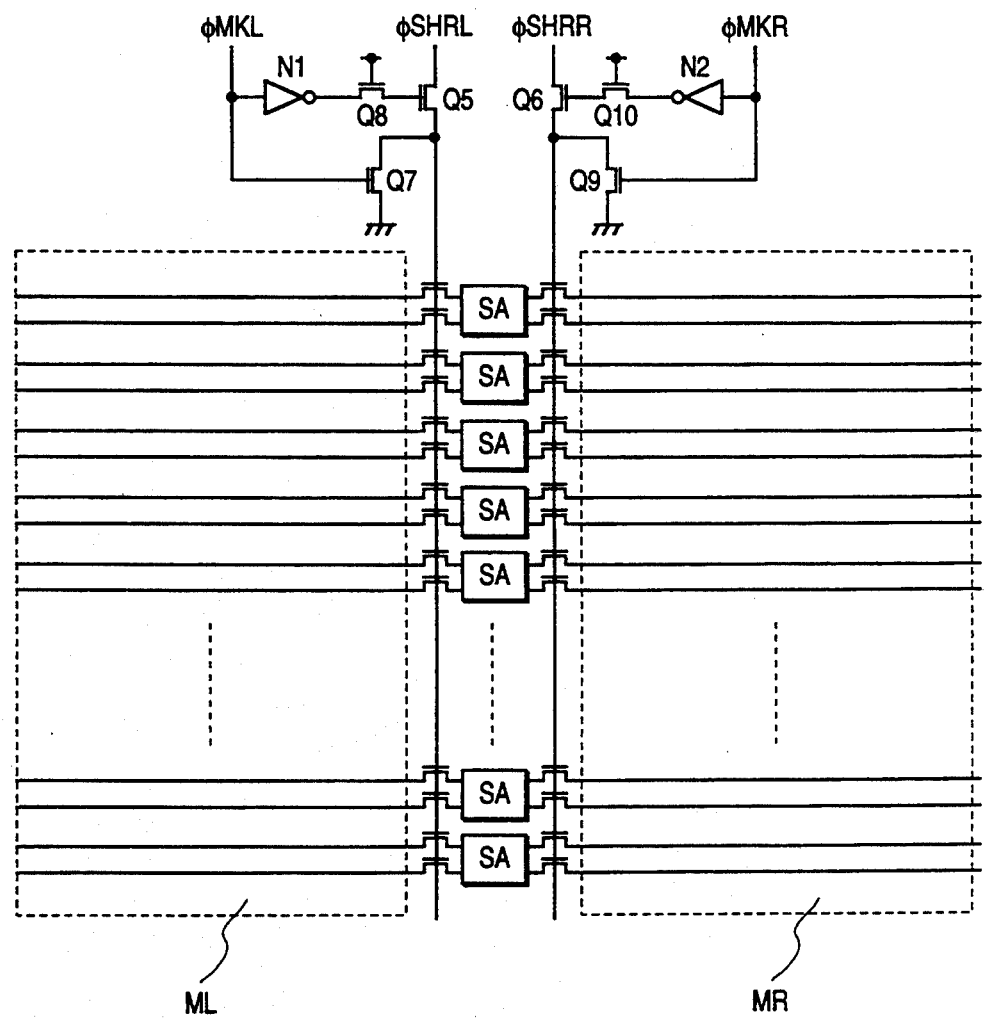
FIG. 20 is a schematic circuit diagram for explaining another embodiment of the fault relieving method in the large-scale semiconductor integrated circuit device according to the present invention.

FIG. 20 is a schematic circuit diagram showing another embodiment of the fault relieving method of the semiconductor integrated circuit according to the present invention.

In case the DC defect is present in the aforementioned memory mats, the memory array using the shared sense amplifiers of FIG. 19 utilizes as the aforementioned isolating means the switch MOSFETs for selecting the sense amplifiers.

Specifically, these switch MOSFETs are interposed between the sense amplifiers SA and the bit lines of the righthand and left-hand memory mats ML and MR and have their gates fed with selection signals φSHRL and φSHRR through transmission gate MOSFETs Q5 and Q6. In case the aforementioned DC defect exists in the mat ML or MR, a mat killer signal φMKR or φMKL is generated to turn off the aforementioned transmission gate MOSFET Q5 or Q6 and turns on a MOSFET Q7 or Q8 thereby to feed the ground potential steadily to the gates of the aforementioned selecting MOSFETs.

As a result, the bit lines of the memory mats having the aforementioned DC defect are fed with no operating current through the sense amplifiers. Thus, the aforementioned DC current pass, if any, will not adversely affect the remaining normal circuits or mats of the 4 Mbit DRAM of FIG. 19, for example. As a result, the memory can be used while exploiting the remaining good memory mats. The addresses can also be prevented from becoming discrete by adopting the aforementioned fault relieving method shown in FIG. 17.

In case a precharge circuit is disposed in the memory mat having a DC defect, it is rendered inoperative by the aforementioned mat killer signal φMK.

In case the aforementioned shared sense amplifier is not used, a mat isolating switch MOSFET may be interposed between the sense amplifier and each of the bit lines so as to cope with the aforementioned defect.

Thus, the subchip can be effectively used by leaving the defective portion in the subchip and by exploiting the good portions (properly operating or non-defective portions) remaining therein thereby reducing the memory circuit storage capacity only rather than being forced to relieve the entire subchip. As a result, the number of subchips to be prepared in advance for overcoming probable defects can be reduced. Since the large-scale semiconductor integrated circuit device, which might otherwise be non-usable or removed as a result of being defective due to a shortage of the remaining usable memory capacity associated therewith, can now be used as completely movable devices, it is possible to enhance the production yield of the expensive large-scale semiconductor integrated circuit device.

Figure 21:
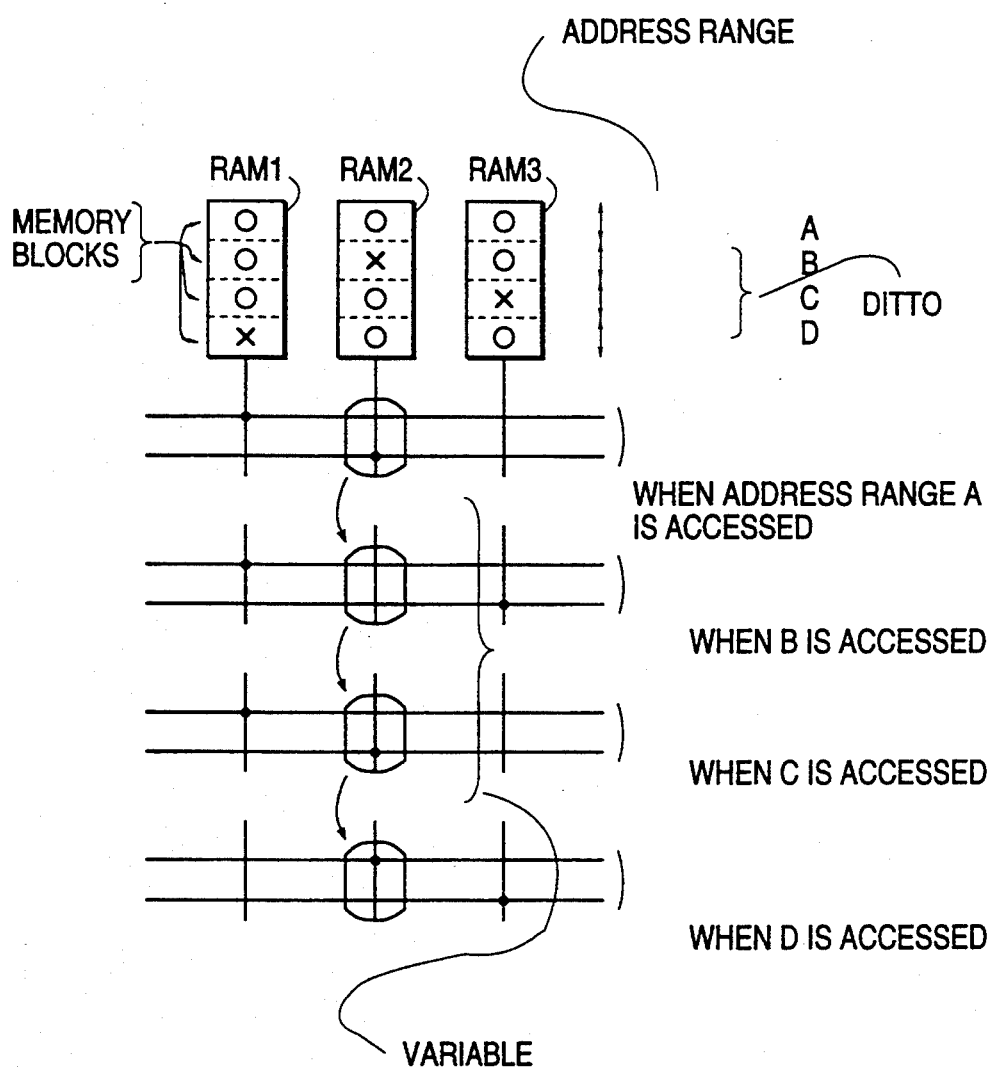
FIG. 21 is a schematic block diagram showing another embodiment of the fault relieving method in the large-scale semiconductor integrated circuit device according to the present invention.

FIG. 21 is a schematic block diagram for explaining another embodiment of the fault relieving method of the semiconductor integrated circuit according to the present invention.

FIG. 21 shows an example in which there is constructed a memory device for storing data of plural bit widths by using a plurality of subchips containing defective portions.

The RAM1 to RAM3 are individually composed of ×4 bits, although not specifically limited thereto, and two of them are combined to construct a memory circuit of ×8 bits. Therefore, each of two data buses is of ×4 bits.

In the large-scale semiconductor integrated circuit device of the prior art, the RAMs and the data buses to be coupled thereto are fixedly connected by hardware. Therefore, the address having a defect cannot be accessed so that it is isolated. In the fault relieving method of this embodiment, on the contrary, the connections between the data terminals of the RAMs and the corresponding data buses are made variable. For this, a later-described I/O switching circuit is interposed between the RAMs and the data buses.

It is assumed, although not especially limitative thereto, that the aforementioned three RAM1 to RAM3 be divided into four memory blocks, of which memory blocks indicated by symbols O are good whereas memory blocks indicated by symbols X are defective.

The aforementioned three RAMs are fed commonly with the address signal and the necessary clock pulses so that they are operated in parallel. If an address range A is designated, all of the RAM1 to RAM3 are good, and the RAM1 and RAM2 are connected with the upper and lower data buses, respectively. At this time, although the RAM3 is likewise accessed, it is not connected with the data buses so that its operations are inconsequential.

When an address range B is accessed, the RAM2 is defective, and the RAM1 and RAM3 are used and connected with the upper and lower data buses, respectively. At this time, the RAM 2 is likewise accessed but is not connected with either of the data buses. There arises no problem even if the defective address is accessed.

When an address range C is accessed, the RAM3 is defective, and the RAM1 and RAM2 are used and connected with the upper and lower data buses, respectively, like the case of the aforementioned address range A. At this time, the RAM3 is likewise accessed but not connected with either of the data buses. There arises no problem even if the defective address is accessed.

When an address range D is accessed, the RAM1 is defective, and the RAM2 and RAM3 are connected with the upper and lower data buses, respectively. At this time, the RAM 1 is likewise accessed but is not connected with either of the data buses. There arises no problem even if the defective address is accessed.

The aforementioned RAM1 to RAM3 have fault relieving circuits using redundancy circuits like the DRAM of the prior art, although it is not specifically limited thereto. In this case, a fault relief is accomplished without overlap of the defects in each of the memory blocks of the RAMs, i.e. RAM1 to RAM3. Specifically, the fault relief operation is accomplished not for all the defects present but rather partially leaving the defective portions on condition of no overlap of the defective portions so that the redundancy circuits can be efficiently used.

By thus combining the subchips having the remaining defective portions so that they may be equivalently reproduced as one memory circuit, one of the three subchips is disused, as viewed from the outside of the large-scale semiconductor integrated circuit device. As a result, the subchips can be effectively used since a good semiconductor memory device can now be obtained from the three memory chips, which would not have been usable according to the prior art. This makes it possible to reduce the number of subchips to be prepared in advance for overcoming probable defects. In other words, the substantial degree of integration can be enhanced. Since the large-scale semiconductor integrated circuit device, which might otherwise be disused as a result of being classified as defective due to shortage of the non-defective memory capacity remaining therein, can be used as completely movable devices, it is possible to enhance the production yield of the expensive largescale semiconductor integrated circuit device.

Incidentally, two RAMs can be used and selectively connected with the data buses without any overlap of the defective portions so that they can be made equivalent to one RAM. In this case, one of two is deemed as defective.

As a result, the fault relieving method of this embodiment can have its relief efficiency enhanced even more so if one memory circuit is constructed with more subchips. For example, there are used nine RAMs of ×1 bit, of which eight are combined and selectively connected with the data buses of x 8 bits on condition that only one is defective within a predetermined address range. Although defective bits are discretely present in all the nine subchips, according to the present structure, it can be made to have the equivalent effect of disusing only one subchip substantially as the defective chip.

Figure 22:
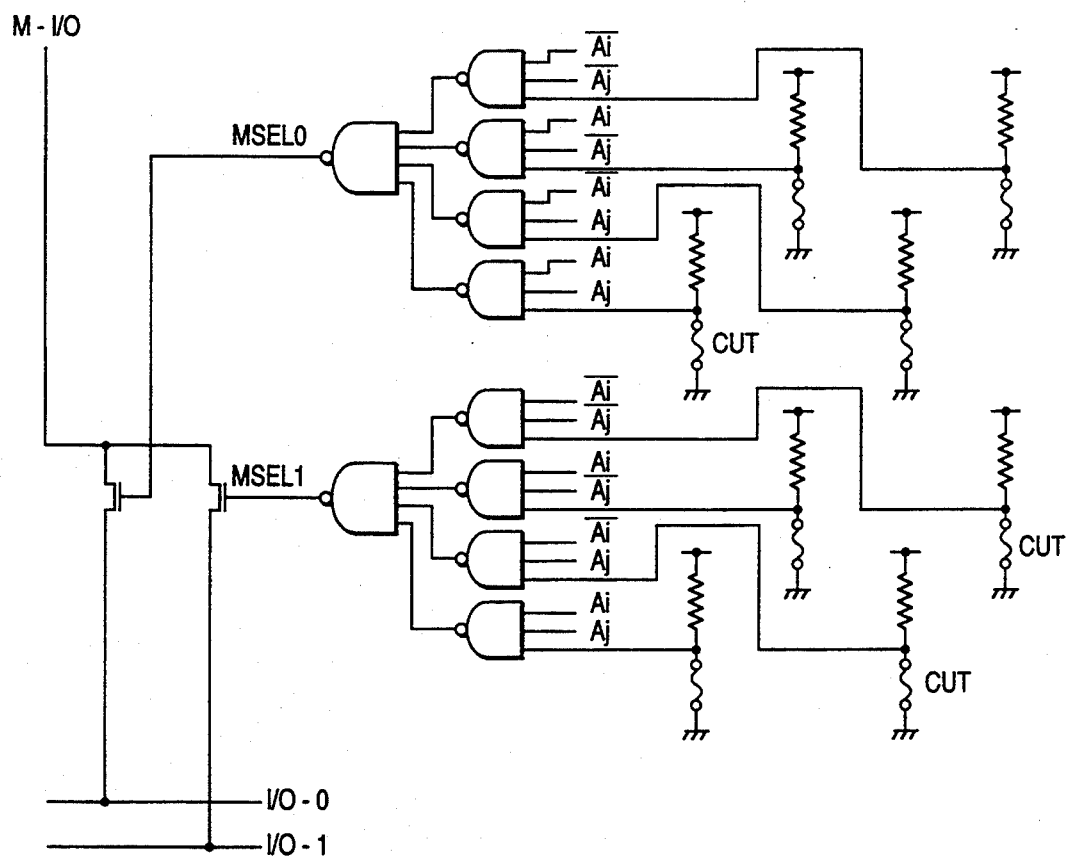
FIG. 22 is a circuit diagram showing one embodiment of the I/O switching circuit to be used in the aforementioned fault relieving method.

FIG. 22 is a circuit diagram showing one embodiment of the I/O switching circuit to be interposed between the data terminals of the aforementioned RAM2 and the data buses.

In this embodiment, although not specifically limited thereto, a NAND gate circuit receives address signals Ai and Aj designating the aforementioned memory blocks and is fed with an enable signal which is formed in a program circuit composed of the series connection of a fuse means and a resistor. If this fuse means is cut, as shown, the signal at the high level is fed through the resistor to the NAND gate circuit so that a block address designated by the address signals Ai and Aj of 2 bits fed to the NAND gate circuit becomes effective to turn on the switch MOSFET for connecting the data terminal M-I/O of the RAM2 with the aforementioned data bus 1/O-0 or I/O-1.

Specifically, when both the address signals $\overline{Ai}$ and $\overline{Aj}$ for designating the address range A are at the high level, the corresponding fuse means of the AND gate circuit are cut to form a memory selecting circuit MSEL1. As a result, the data terminal M-I/0 of the RAM2 is connected with the lower data bus 1/O-1, as has been described hereinbefore. When both the address signals Ai and $\overline{Aj}$ for designating the address range B are at the high level, the corresponding fuse means of the AND gate circuit are not cut to set both the memory selecting signals MSEL0 and MSEL1 to the low level. As a result, both the switch MOSFETs are turned off to isolate the data terminal M-I/O of the RAM2 from both the data buses. When both the address signals $\overline{Ai}$ and Aj for designating the address range C are at the high level, the corresponding fuse means of the AND gate circuit are cut to form a memory selecting circuit MSEL1. As a result, the data terminal M-I/O of the RAM2 is connected with the lower data bus I/O-1, as has been described hereinbefore. When, moreover, both the address signals Ai and Aj for designating the address range D are at the high level, the corresponding fuses of the AND gate circuits are cut to form the memory selecting signal MSEL0. As a result, the data terminal M-I/O of the RAM2 is connected with the upper data bus I/O-0, as has been described hereinbefore.

Figure 23:
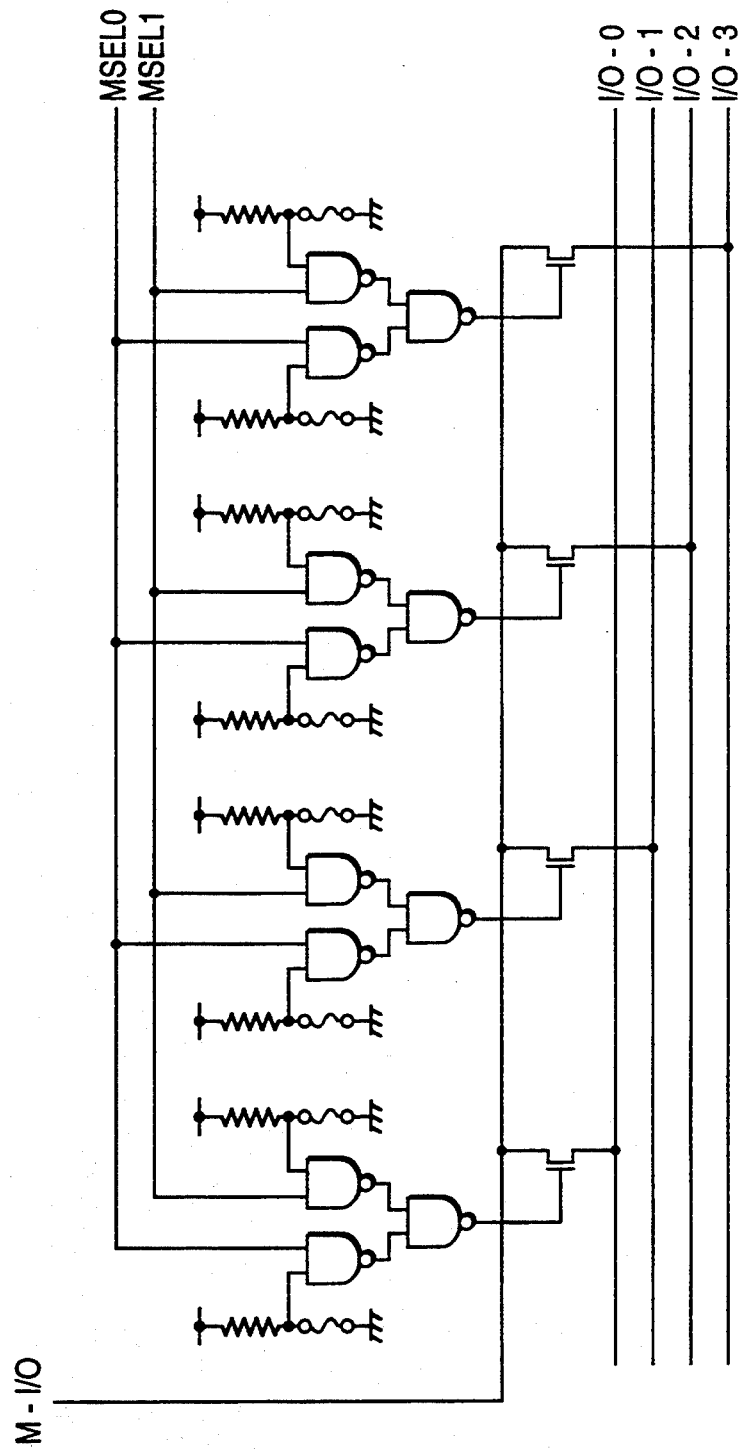
FIG. 23 is a circuit diagram showing another embodiment of the I/O switching circuit to be used in the aforementioned fault relieving method.

FIG. 23 is a circuit diagram showing another embodiment of the I/O switching circuit to be interposed between the data terminals of the RAMs and the data buses.

This embodiment is exemplified by a switch circuit for either connecting one data terminal M-I/O of the RAM with any of the four data buses 1/O-0 to I/O-3 or not.

The selecting signals MSEL0 and MSEL1 are those which are formed in the address decoder circuit. These signals are combined with the NAND gate circuits, which have their gates opened when the fuse means are cut, and the NAND gate circuits, which act substantially as OR gates, to switch the MOSFETs corresponding to the aforementioned data buses I/O-0 to I/O-3.

If the address signal or decode signal corresponding to that cut by the aforementioned fuse means is made effective, the data terminals of the RAMs can be isolated from any of the data buses at the instant when the circuit is completed over the semiconductor wafer. As a result, it is possible to facilitate the single test of the RAM by using the earlier described testing pads.

Figure 24:
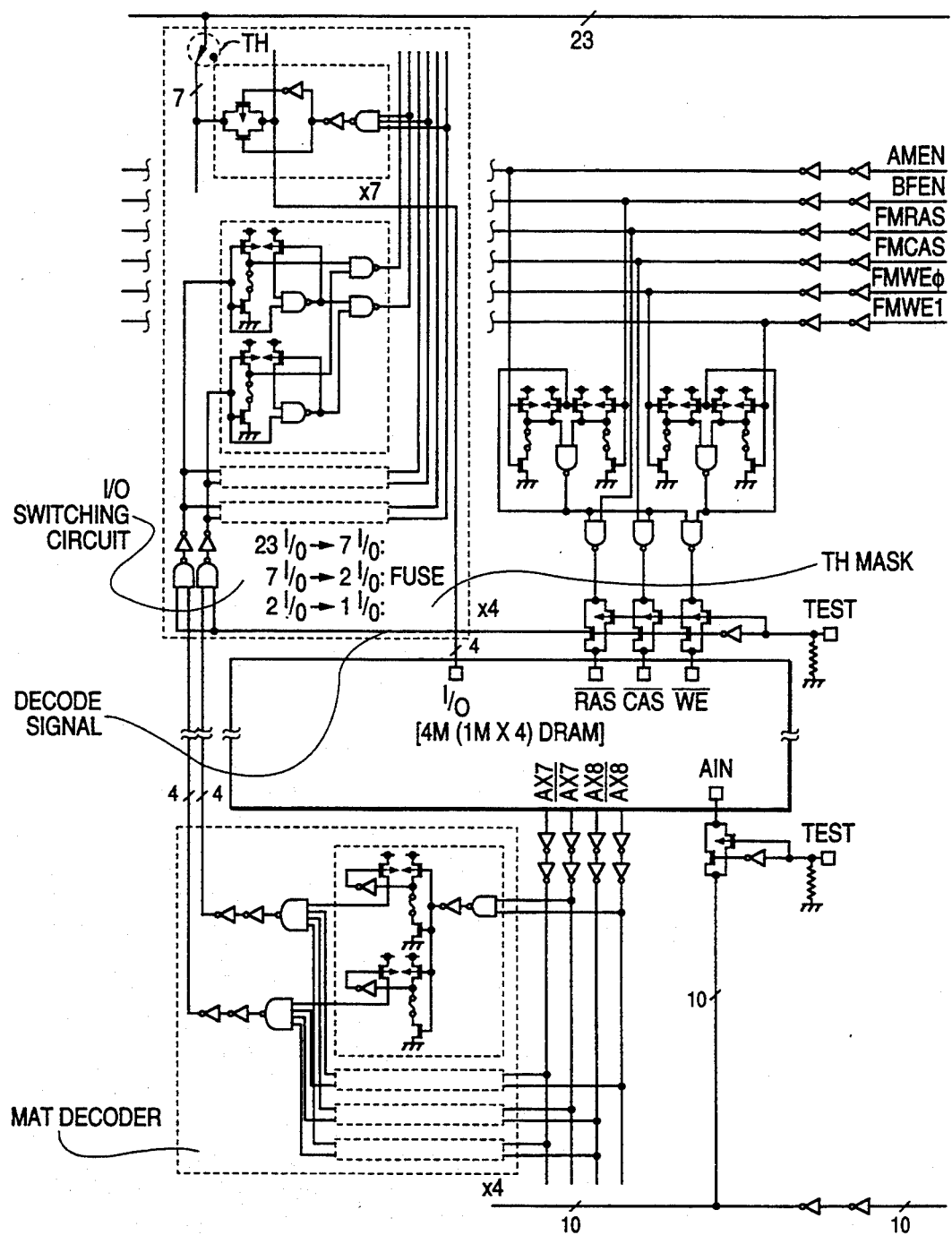
FIG. 24 is a circuit diagram showing one embodiment of the peripheral circuit of the dynamic RAM to which is applied the aforementioned fault relieving method.

FIG. 24 is a circuit diagram showing one specific embodiment of the aforementioned I/O switching circuit with respect to a DRAM of about 4 Mbits.

The address terminal Ai and the clock terminals $\overline{RAS}$, $\overline{CAS}$ and $\overline{WE}$ are provided with the testing pads, as indicated by square symbols □, and are respectively connected with the outside (or the system side) through a CMOS circuit composed of a parallel connection of N-channel and P-channel MOSFETS. These switch MOSFETs are turned on in response to the signal of the test terminal TEST which is steadily fed with the ground potential of the circuit by a pull-down resistor. In the testing operations, the aforementioned test terminal TEST is fed with the high level such as the power voltage $V_{cc}$ so that the switch MOSFETs can be turned off to isolate the DRAM from the system side.

Moreover, the signals to be fed to the aforementioned clock terminals $\overline{RAS}$, $\overline{CAS}$ and $\overline{WE}$ can be switched in accordance with the applications of the foregoing embodiments by a circuit composed of AND gate circuits and fuse means.

Each data terminal I/O is composed of 4 bits and is connected with any of seven prepared sub-data buses through the CMOS switch circuit like the aforementioned one. These seven sub-data buses are connected with any of twenty three system buses through a master slice TH. By this master slice, more specifically, the seven I/Os are selected from the twenty three I/Os. From these seven I/Os, moreover two I/Os are selected by a fuse circuit which receives two kinds of decode signals. Moreover, one I/O from the two I/Os is designated by the two kinds of memory selecting signals which are formed by a mat decoder receiving address signals AX7 and AX8 of 2 bits outputted from the DRAM.

By providing such variable I/O switching circuit, a partial defect, if any in the DRAM, can be borne by another-DRAM so that the defective DRAM can be effectively used.

This is naturally applied to not only the aforementioned DRAM, but also to the SRAM or, if necessary, an EPROM or EEPROM to be packaged in the large-scale semiconductor integrated circuit device.

The operational effects obtainable from the foregoing embodiments will now be summarized in the following discussion.

(1) In the large-scale semiconductor integrated circuit device including a plurality of subchips packaged therein and having specific functions, a capacitance cutting buffer circuit is disposed commonly at either each terminal of each of said subchips or two or more terminals arranged close to each other, and a driver is disposed at each of the points divided from a relatively long wiring line. As a result, there can be attained an effect that the signal transmission delay can be lightened to speed up the operations.

(2) The terminal of each of said subchips is provided with a probing pad. As a result, there can be attained effects that the subchips can have their operations tested independently of one another for a shortened time period and that the signal delay in the ordinary operations can be prevented by the capacitance cutting buffer circuit.

(3) Switch means to be switched by memory means, which can be programmed after a circuit has been completed over a semiconductor wafer, can be used to set at least one address signal necessary for accessing a memory circuit, data and a clock pulse. There can be attained an effect that the built-in memory circuit can be made versatile.

(4) A shared signal transmission route facilitates the transmission of an address signal and data in a time sharing manner. As a result, there can be attained an effect that the number of wiring channels to be formed in the large-scale semiconductor integrated circuit device can be reduced.

(5) The memory circuit to be coupled to said shared signal transmission route constitutes said subchip having an address terminal and a data terminal, and the address terminal is provided with a latch circuit which responds to an address strobe signal to receive an address signal fed from said signal transmission route. According to this structure, there can be attained effects that the signals can be separated upstream of the terminals of the subchips to reduce the number of the wiring lines required, as described above, and that the subchips can be tested independently of one another and made versatile.

(6) Simultaneously operable circuit blocks are dispersed (arranged) in each of said subchips, and power supply lines are disposed to correspond to the scattered circuit blocks. As a result, there can be attained an effect that the operating currents of the power wiring lines can be scattered to prevent the operating margin from being dropped by the power noises.

(7) Said subchips are memory circuits whereas the simultaneously operable circuit blocks are memory mats. As a result, there can be attained an effect that the simultaneously operable circuit blocks can be easily separated by sharing the address designations.

(8) Said memory circuit is the subchip as has been described above. Since the subchips can be separated from the system side by the switches, there can be attained an effect that the operation tests can be simplified to prevent the accompanying signal delay.

(9) Said memory means includes fuse means which turns on, when cut, the switch circuit for transmitting the corresponding address signal, data and clock pulse to the memory circuit. Since, according to this structure, the subchips are made separately of the system side, the single test can be instantly accomplished, and the applications can be determined by the cut. As a result, there can be attained an effect that the program can be easily made.

(10) A switch circuit is to be switched by the combination of a bus width setting signal and an address signal stored in the memory means which can be programmed after a circuit has been completed over a semiconductor wafer, to provide a function to selectively connect a plurality of data terminals of one or more built-in memory circuits and data buses of a plurality of bits in accordance with said bus width setting. As a result, there can be attained an effect that the built-in memory circuit can be made versatile.

(11) A comparator circuit is made to include a first word line to be coupled to a small number of memory cells and a second word line to be coupled to a large number of memory cells, for comparing the index information stored in the memory cell corresponding to said first word line and the search information fed from the outside; and a memory circuit for reading out the stored information of the memory cell coupled to said second word line only in case the two informations are coincident. Since the first word line can be selected at a high speed according to this structure, the aforementioned comparing operations can be accomplished for the reading operation from the second word line to be selected simultaneously. As a result, there can be attained an effect that the memory circuit has a high-speed searching function.

(12) The stored information of the memory cell coupled to said second word line is transferred in parallel to a latch circuit in accordance with the coincidence signal coming from said comparator circuit and is serially outputted through said latch circuit. As a result, there can be attained an effect that the search data of multiple bits can be outputted to a fewer number of signal buses.

(13) Said word line selecting circuit accomplishes its selecting operations in accordance with the address signal which is formed by an address counter circuit for incrementing operations when the output of said comparator circuit is not indicative of a coincidence. As a result, there can be attained an effect that the automatic searching function can be realized.

(14) The memory circuits having the aforementioned high-speed searching function is constructed into the large-scale semiconductor integrated circuit device as discussed with respect to the aforementioned capacitance cutting buffer circuit and the subchips having the testing pads.

(15) Each of the subchips is made to have a test circuit for generating a signal to test the operations of each of said subchips and decide the propriety of the same, and a memory circuit for latching the propriety result of said test circuit. As a result, there can be attained an effect that the final check and maintenance check of the large-scale semiconductor integrated circuit device can be easily accomplished.

(16) The subchips constitute memory circuits each equipped with a flag for storing said test results at each function block. As a result, there can be attained an effect that the memory accesses can be accomplished after the internal states of the memory circuits have been examined.

(17) The word line and bit line selecting circuit of the memory circuit is equipped with a flag for storing said propriety test result for each unit address. As a result, there can be attained an effect that it is possible to decide in accordance with the state of the flag whether or not the memory access of the actually selected storage locations are to be implemented.

(18) The memory circuit has a continuous access function to skip the selecting operations of the fault word and bit lines in accordance with the fault flag stored in the flag provided for each of the word and bit line selecting circuits. As a result, there can be attained an effect that the fault relieving function can be substantially realized.

(19) In a large-scale semiconductor integrated circuit device packaging a plurality of subchips having specific functions, such one of a plurality of memory mats of memory circuits constituting subchips as has a DC fault is electrically isolated by a switch circuit. As a result, there can be attained an effect that the remaining operable portions can be effectively used.

(20) In a large-scale semiconductor integrated circuit device packaging a plurality of subchips having specific functions, a fault relieving method by which an address converting circuit for a memory circuit constituting said subchips is provided for access conversions so as not to access a fault address so that a memory cell array may be selected. As a result, there can be attained an effect that the device can be handled as the complete chip from the system side.

(21) The memory cell array is divided into a plurality of blocks so that the address for designating the blocks is subjected to the address conversion. As a result, there can be attained an effect that the number of address conversion bits can be reduced.

(22) The memory circuits have a fault address memory circuit and an address comparator circuit for address conversions when a fault address is accessed to. As a result, there can be attained an effect that the device can be handled as a complete chip from the system side.

(23) The selection switch MOSFETs in the shared sense amplifiers are used as means for isolating the memory mats having a DC defect. As a result, there can be attained an effect that the aforementioned fault relieving method can be realized by adding the simple circuit.

(24) In a large-scale semiconductor integrated circuit, device packaging a plurality of subchips having specific functions, a fault relieving method associated therewith is characterized in that a combination having no fault bit is selected from a plurality of memory circuits composing said subchips in accordance with address information which instructs connection of the data terminal selectively to a data bus so that it may be used for storing data composed of bits of a fewer number than that corresponding to the total terminal number of said memory circuits. As a result, there can be attained an effect that the memory chip of a complete device can be equivalently constructed by using the memory circuits containing defective bits.

(25) The address space of the aforementioned memory circuit is divided into a plurality of blocks, wherein with respect to each of which the subchips having no defect overlap are combined so that the address signal for designating the block may be decoded to connect the data terminals of the aforementioned subchip and the data buses selectively. According to this structure, there can be attained an effect that the aforementioned subchip combinations can be accomplished by the decode output of the simple block addresses.

Although the present invention has been specifically described hereinbefore in connection with the various preferred embodiments, it should not be considered as necessarily being limited thereto but can be obviously modified or changed therefrom without departing from the technical scope and spirit of the invention. For example, the large-scale semiconductor integrated circuit device can take a variety of modes of embodiments, such as a large-capacity memory device composed of memory circuits or a large-scale microcomputer system having a built-in information processing device such as a microprocessor. On the other hand, the aforementioned large-scale semiconductor integrated circuit device is a semiconductor integrated circuit device having such a large scale that one or a small number of semiconductor integrated circuit devices are formed from one semiconductor wafer, as has been described hereinbefore. The individual circuits of subchip structures to be built in such semiconductor integrated circuit device should not be limited to the aforementioned dynamic RAM, static RAM or gate array for realizing the specific applications but may be an EPROM or EEPROM, a DMAC or M.MU constituting the peripheral circuit of a microcomputer, or a coprocessor having specific functions such as floating point computing or drawing processing functions.

The present invention can be widely used as the large-scale semiconductor integrated circuit device and the fault relieving method for the subchips packaged in the circuit device.

The effects obtainable from the representatives of the invention disclosed hereinbefore will be described in the following. Specifically, in the large-scale semiconductor integrated circuit device including a plurality of subchips packaged therein and having specific functions, a capacitance cutting buffer circuit is disposed commonly at either each terminal of each of said subchips or two or more terminals arranged close to each other, and a driver is disposed at each of the points divided from a relatively long wiring line. As a result, there can be attained an effect that the signal transmission delay can be significantly reduced so as to speed up the operations. The terminal of each of said subchips is provided with a probing pad. As a result, there can be attained effects that the subchips can have their operations tested independently of one another for a shortened time period and that the signal delay associated with the ordinary operations thereof can be prevented by the capacitance cutting buffer circuit.

Switch means to be switched by memory means, which can be programmed after a circuit has been completed over a semiconductor wafer, can be used to set at least one address signal necessary for accessing a memory circuit, data and a clock pulse. There can be attained an effect that the built-in memory circuit can be made versatile. The memory means includes fuse means which turn on, when cut (open-circuited), the switch circuit for transmitting the corresponding address signal, data and clock pulse to the memory circuit. Since, according to this structure, the subchips are made separately from the system side, the single test can be instantly performed, and the applications can be determined by the specific cut. As a result, there can be attained an effect that the program can be easily made.

Simultaneously operable circuit blocks are dispersed in each of said subchips, and power supply lines are disposed to correspond to the scattered circuit blocks. As a result, there can be attained an effect that the operating currents of the power wiring lines can be scattered (distributed) to prevent the operating margin from being dropped by the power noises. A shared signal transmission route is caused to transmit an address signal and data in a time sharing manner. As a result, there can be attained an effect that the number of wiring channels to be formed in the large-scale semiconductor integrated circuit device can be reduced. A switch circuit is to be switched by the combination of a bus width setting signal and an address signal stored in the memory means which can be programmed after a circuit has been completed over a semiconductor wafer, to provide a function to selectively connect a plurality of data terminals of one or more built-in memory circuits and data buses of a plurality of bits in accordance with said bus width setting. As a result, there can be attained an effect that the built-in memory circuit can be made versatile.

A comparator circuit is made to include a first word line to be coupled to a small number of memory cells and a second word line to be coupled to a large number of memory cells, for comparing the index information stored in the memory cell corresponding to said first word line and the search information fed from the outside; and a memory circuit for reading out the stored information of the memory cell coupled to said second word line only in the case the two informations are coincident. Since the first word line can be selected at a high speed according to this structure, the aforementioned comparing operations can be accomplished for the reading operation from the second word line to be selected simultaneously. As a result, there can be attained an effect that the memory circuit has a high-speed searching function.

Each of the subchips is implemented with a test circuit for generating a signal to test the operations of each of said subchips and decide the propriety of the same, i.e. whether a malfunction or defect is determined to be present, and a memory circuit for latching the propriety result of said test circuit. As a result, there can be attained an effect that the final check and maintenance check of the large-scale semiconductor integrated circuit device can be easily performed. In a large-scale semiconductor integrated circuit device packaging a plurality of subchips having specific functions, such one of a plurality of memory mats of memory circuits constituting subchips as has a DC fault is electrically isolated by a switch circuit. As a result, there can be attained an effect that the remaining operable portions can be effectively used.

In a large-scale semiconductor integrated circuit device packaging a plurality of subchips having specific functions, a fault relieving method associated therewith is characterized in that a combination having no fault bit is selected from a plurality of memory circuits composing said subchips in accordance with address information to connect the data terminal selectively to a data bus so that it may be used for storing data composed of bits corresponding to fewer memory cell locations than that of the total number of memory cell locations associated with said memory circuits. As a result, there can be attained an effect that the memory chip of a complete device can be equivalently constructed by using the memory circuits containing defective bits. In a large-scale semiconductor integrated circuit device packaging a plurality of subchips having specific functions, a fault relieving method by which an address converting circuit for a memory circuit constituting said subchips is provided for access conversions so as not to access to a fault address so that a memory cell array may be selected. As a result, there can be attained an effect that the device can be handled as the complete chip from the system side.

What is claimed is:

1. A semiconductor integrated circuit device comprising:
   a plurality of circuit blocks each of which has at least one predetermined function and provided with at least one external terminal;
   buffer circuits being respectively coupled either to each external terminal of each of said circuit blocks or in common to two or more external terminals which are provided in close proximity to each other;
   wiring lines capable of coupling said buffer circuits to one another; and
   drivers being respectively provided at each branching of divided wiring lines,
   wherein capacitances at said external terminals are isolated from capacitances at wiring lines by said buffer circuits.

2. A semiconductor integrated circuit device according to claim 1, wherein each one of said at least one external terminal of each of said circuit blocks is provided with a probing pad.

3. A semiconductor integrated circuit device comprising:
   plural switch means each being controllably actuated for transmitting to a memory circuit portion of the device a respective one of signals taken from a signal group including an address signal, data signal and a clock pulse signal; and
   memory means programmably actuating said plural switch means,
   wherein said memory circuit portion corresponds to one of plural circuit blocks included in the device,
   wherein each of said circuit blocks has at least one predetermined function and includes at least one external terminal,
   wherein there is coupled to each external terminal or in common to two or more external terminals, which are in close proximity to each other and which are for a common connection to external wirings, a buffer circuit for effecting electrical isolation between capacitances at the respective external terminals and capacitances of associated wiring lines interconnecting external terminals of different circuit blocks, and
   wherein in those wiring lines which are provided externally of said circuit blocks and for electrically interconnecting different ones of said circuit blocks there are provided drivers respectively coupled to wiring lines associated with each occurrence of a branching thereof.

4. A semiconductor integrated circuit device according to claim 3, wherein said memory means includes plural fuse means, said fuse means being coupled so that in response to fuse connections thereof being cut, said plural switch means which are for transmitting the address signal, data signal and clock pulse signal to the circuit blocks associated with said memory circuit portion, respectively, turn on.

5. A semiconductor integrated circuit device according to claim 1,
   wherein each of said circuit blocks includes a plurality of first circuits and a plurality of second circuits,
   wherein each of said first circuits is coupled to a first power supply line and each of said second circuits is coupled to a second power supply line,
   wherein at least one of first circuits and at least one of second circuits are simultaneously powered by said first and second power supply lines, respectively, and
   wherein said first and second power supply lines are capable of supplying substantially the same voltage.

6. A semiconductor integrated circuit device according to claim 5, wherein said circuit blocks are memory circuit and said first circuits are memory mats, respectively.

7. A semiconductor integrated circuit device according to claim 1, further comprising a switch circuit, provided between a data bus and data terminals of at least one circuit block, capable of programmably setting the bit width of said data bus to be coupled to said data terminals.

8. A semiconductor integrated circuit device according to claim 1,
   wherein said circuit blocks are memory circuits;
   wherein each of said memory circuits is responsive to both a first control signal for write/read mode selection and address signals for selective accessing of a portion of said memory circuit for write/read data, and wherein said address signals are transmitted in a time shared manner with said write/read data associated therewith using a common bus line provided outside of said memory circuits.

9. A semiconductor integrated circuit device according to claim 8, wherein each of said memory circuits includes an address terminal and a data terminal, said address terminal is provided with a latch circuit which in response to an address strobe signal, corresponding to said second control signal, allows transfer of an address signal via said common bus line and said latch circuit to said address terminal and subsequently allows transfer of write/read data via said common bus line to and from said data terminal.

10. A semiconductor integrated circuit device comprising:
a memory cell arrangement having an indexing memory cell portion and a data storage portion;
a comparator circuit including a first word line to be coupled to a small number of memory cells, associated with said indexing memory cell portion, to be simultaneously selected by a word line selecting circuit and a second word line to be coupled to a relatively large number of memory cells associated with said data storage portion, for comparing index data information stored in the selected memory cells corresponding to said first word line and search data information fed from the outside; and
a circuit for reading out stored information of the selected memory cells coupled to said second word line only when index and search data information are coincident.

11. A semiconductor according to claim 10, wherein the stored information of accessed memory cells coupled to said second word line are transferred in parallel to a latch circuit in accordance with a coincidence signal outputted from said comparator circuit and are serially outputted through said latch circuit.

12. A semiconductor integrated circuit device according to claim 10 or 11, wherein said word line selecting circuit accomplishes its selecting operations in accordance with the address signal which is formed by an address counter circuit for incrementing operations when the output of said comparator circuit is not coincident.

13. A semiconductor integrated circuit device, according to claim 12, wherein said memory cell arrangement is comprised of one of plural circuit blocks in the device.

14. A semiconductor integrated circuit device according to claim 2, wherein in ones of said wiring lines for bi-directional signal transmission, said drivers are provided as inversely parallel-connected pairs of drivers at each said branching.

15. A semiconductor integrated circuit device according to claim 14, wherein each of said drivers is comprised of a pair of cascade-connected logic inverter circuits.

16. A semiconductor integrated circuit device according to claim 2, wherein in ones of said wirings, connected to said external terminals for bi-directional signal transmission, said buffer circuits are provided as inversely parallel-connected pairs of drivers.

17. A semiconductor integrated circuit device according to claim 16, wherein each driver of said buffer circuits is comprised of a pair of cascade-connected logic inverter circuits.

18. A wafer-scale semiconductor integrated circuit device according to claim 15, wherein in ones of said wirings, connected to said external terminals for bi-directional signal transmission, said buffer circuits are provided as inversely parallel-connected pairs of drivers.

19. A semiconductor integrated circuit device according to claim 18, wherein each driver of said buffer circuits is comprised of a pair of cascade-connected logic inverter circuits.

20. A semiconductor integrated circuit device according to claim 3, wherein each one of said at least one external terminal of each of said circuit blocks is provided with a probing pad.

21. A semiconductor integrated circuit device comprising:
a plurality of circuit blocks each of which has at least one predetermined function and is provided with at least one external terminal;
buffer circuits each of which has a first terminal coupled to each external terminal of said circuit blocks; and
wiring lines capable of coupling second terminals of said buffer circuits to one another,
wherein capacitances at said external terminals are isolated from capacitances at wiring lines by said buffer circuits.

22. A semiconductor integrated circuit device according to claim 21,
wherein each of said circuit blocks includes a plurality of first circuits and a plurality of second circuits,
wherein each of said first circuits is coupled to a first power supply line and each of said second circuits is coupled to a second power supply line,
wherein at least one of first circuits and at least one of second circuits are simultaneously powered by said first and second power supply lines, respectively, and
wherein said first and second power supply lines are capable of supplying substantially the same voltage.

23. A semiconductor integrated circuit device according to claim 21,
wherein said circuit blocks are memory circuits, respectively,
wherein each of said memory circuits is responsive to both a write/read data and address signals, and
wherein said address signals are transmitted in a time shared manner with said write/read data using a common bus line provided outside of said memory circuits.

24. A semiconductor integrated circuit device according to claim 21, further comprising a switch circuit, provided between a data bus and data terminals of at least one circuit block, capable of programmably setting the bit width of said data bus to be coupled to said data terminals.

* * * * *